(12) United States Patent  (10) Patent No.: US 9,425,334 B2
Baird et al.  (45) Date of Patent: Aug. 23, 2016

(54) METHODS AND APPARATUS FOR PATTERNING PHOTOVOLTAIC DEVICES AND MATERIALS FOR USE WITH SUCH DEVICES

(75) Inventors: Brian W. Baird, Portland, OR (US); Timothy D. Gerke, Portland, OR (US)

(73) Assignee: Fianium Ltd, Southampton (GB)

( * ) Notice: Subject to any disclaimer, the term of this patent is extended or adjusted under 35 U.S.C. 154(b) by 143 days.

(21) Appl. No.: 13/820,997

(22) PCT Filed: Sep. 6, 2011

(86) PCT No.: PCT/EP2011/065414
§ 371 (c)(1),
(2), (4) Date: Jun. 6, 2013

(87) PCT Pub. No.: WO2012/032063
PCT Pub. Date: Mar. 15, 2012

(65) Prior Publication Data
US 2013/0244449 A1  Sep. 19, 2013

Related U.S. Application Data

(60) Provisional application No. 61/380,306, filed on Sep. 6, 2010, provisional application No. 61/460,386, filed on Dec. 31, 2010, provisional application No. 61/477,946, filed on Apr. 21, 2011, provisional application No. 61/480,320, filed on Apr. 28, 2011.

(30) Foreign Application Priority Data

Sep. 6, 2010 (GB) .................................. 1014778.3

(51) Int. Cl.
*H01L 21/00* (2006.01)
*H01L 31/0236* (2006.01)
(Continued)

(52) U.S. Cl.
CPC ........ *H01L 31/0236* (2013.01); *B23K 26/0624* (2015.10); *B23K 26/0732* (2013.01);
(Continued)

(58) Field of Classification Search
None
See application file for complete search history.

(56) References Cited

U.S. PATENT DOCUMENTS 4,292,092 A  9/1981  Hanak
4,943,700 A  7/1990  Hughs et al.
(Continued)

FOREIGN PATENT DOCUMENTS

EP  1716964 A1  11/2006
JP  2007194605 A  8/2007

OTHER PUBLICATIONS

Tanaka et al., English machine translation of JP publication JP2007194605, dated Aug. 2, 2007.*
(Continued)

*Primary Examiner* — Angel Roman
(74) *Attorney, Agent, or Firm* — Peter J. Rainville

(57) ABSTRACT

A picosecond laser beam shaping assembly is disclosed for shaping a picosecond laser beam for use in patterning (e.g., scribing) semiconductor devices. The assembly comprises a pulsed fibre laser source of picosecond laser pulses, a harmonic conversion element for converting laser pulses at a first laser wavelength having a first spectral bandwidth to laser pulses at a second laser wavelength having a second spectral bandwidth, and a beam shaping apparatus for shaping the laser beam at the second laser wavelength, the beam shaping apparatus having a spectral bandwidth that substantially corresponds to the second spectral bandwidth so as to produce a laser beam having a substantially rectangular cross-sectional profile.

27 Claims, 16 Drawing Sheets

(51) Int. Cl.
*B23K 26/073* (2006.01)
*H01L 21/268* (2006.01)
*H01L 31/073* (2012.01)
*H01L 31/0749* (2012.01)
*H01L 21/78* (2006.01)
*H01L 31/18* (2006.01)
*H01L 31/046* (2014.01)
*H01L 31/0463* (2014.01)
*B23K 26/40* (2014.01)
*B23K 26/06* (2014.01)

(52) U.S. Cl.
 CPC .............. *B23K26/364* (2015.10); *B23K 26/40* (2013.01); *H01L 21/268* (2013.01); *H01L 21/78* (2013.01); *H01L 31/046* (2014.12); *H01L 31/0463* (2014.12); *H01L 31/073* (2013.01); *H01L 31/0749* (2013.01); *H01L 31/18* (2013.01); *B23K 26/0635* (2013.01); *B23K 2203/172* (2015.10); *Y02E 10/543* (2013.01)

(56) References Cited

U.S. PATENT DOCUMENTS

| | | | |
|---|---|---|---|
| 6,281,471 | B1 | 8/2001 | Smart |
| 6,433,301 | B1 | 8/2002 | Dunsky et al. |
| 7,348,516 | B2 | 3/2008 | Sun et al. |
| 2003/0160034 | A1 | 8/2003 | Filgas et al. |
| 2005/0070035 | A1* | 3/2005 | Yazaki et al. ................... 438/22 |
| 2006/0131289 | A1* | 6/2006 | Jyumonji et al. ......... 219/121.83 |
| 2007/0077696 | A1* | 4/2007 | Tanaka et al. ................. 438/166 |
| 2007/0227578 | A1 | 10/2007 | Perozziello et al. |
| 2008/0029152 | A1 | 2/2008 | Milshtein et al. |
| 2009/0221217 | A1 | 9/2009 | Gajaria et al. |
| 2009/0323741 | A1 | 12/2009 | Deladurantaye et al. |
| 2010/0197116 | A1 | 8/2010 | Shah et al. |
| 2010/0246611 | A1 | 9/2010 | Sun |

OTHER PUBLICATIONS

Amendment to Claims in EP App. No. 11758430.0 (EP2614525). Oct. 30, 2013 (16 pages).
Amendment to Specification in EP App. No. 11758430.0 (EP2614525). Oct. 30, 2013 (1 page).
Letter to EPO accompanying Amendments in EP App. No. 11758430.0 (EP2614525). Oct. 30, 2013 (5 pages).
Communication pursuant to Rules 161(1) and 162 EPC in EP App. No. 11758430.0 (EP2614525). Apr. 19, 2013 (2 pages).
International Search Report issued for PCT/EP2011/065416 (5 pages).
International Preliminary Report on Patentability for PCT/EP2011/065416 (11 pages).
Huber et al., "High speed structuring of CIS thin-film solar cells with picoseconds laser ablation," Proc. of SPIE, 7203, pp. 72030R-1-72030R-9 (2009).
Ruthe et al., "Etching of CuInSe2 thin films-comparison of femtosecond and picosecond laser ablation", Applied Syrface Science, vol. 247, No. 1-4, pp. 447-452 (2005).
Weingarten, "High average power, high pulse energy, picoseconds lasers for material processing", Environment Professional Microtechnologies EPMT Conference, pp. 1-28. (2008).
Baird, "P2 and P3 Spatially shaped laser scribing of CdTe thin film photovoltaic solar cells using a 532 nm picosecond master oscillator fiber power amplifier", 26th European Photovoltaic Solar Energy Conference and Exhibition, (2011).
Schillinger et al., High Speed Laser Scribe System for Large Area Thin Film Solar Cell Manufacturing—3BV.4.6, 24th European Photovoltaic Solar Energy Conference, Sep. 21-25, 2009, Hamburg, Germany [x to right indicates this reference was found as background information in file].
Bonse et al., "Recent advances in laser scribing process technologies for thin film solar cell manufacturing", Solar Energy, Pergamon Press, Oxford, GB, Jan. 1, 2008, pp. 2325-2327, XP008146108, ISSN: 0038-092X, DOI: 10.4229/23RDEUPVSEC2008-3av.1.49 cited in the application.
Lee, "Method for converting a Gaussian laser beam into a uniform beam", Optics Communications, vol. 36, No. 6, Mar. 15, 1981, pp. 469-471.
Compaan et al., Laser scribing of polycrystalline thin films, Optics and Lasers in Engineering 34 (2000) 15-45, Sep. 2000, Toledo, Ohio.
"Thin-film PV Scribing Using a High-Energy Picosecond Pulsed Fiber Laser", Application Lab Notes posted on www.fianium.com.
Hermann et al., "Selective ablation of thin films with short and ultrashort laser pulses", Applied Surface Science, vol. 252, 2006, pp. 4814-4815.
Huber et al., "Selective structuring of thin-film solar cells by ultrafast laser ablation", Proc. of SPIE vol. 6881, 688117, (2008).
Baird, "Picosecond laser processing of semiconductor and thin film devices", Proc. of SPIE, 7580, pp. 15800Q-1-75800Q-9, (2010).
Steiger et al., "Micro-processing and structuring of Si and CIS thin-film solar cells with an ultrafast picoseconds laser", 5th International Congress on Laser Advanced Materials Processing, Kobe Japan (2009).
Shao et al., "Radio-frequency-magnetron-sputtered CdS/CdTe solar cells on soda-lime glass", Appl. Phys. Lett., 69 pp. 3045-3047 (1996).
Pook et al., "Effects of post-deposition treatments on surfaces of CdTe/Cds solar cells", Appl. Phys. Lett. 97, pp. 172109-1 (2010).
EPO Rule 71(3) Intention to Grant in EP App. No. 11754384. Sep. 8, 2015 (5 pages).
EPO Rule 71(3) Intention to Grant in EP App. No. 11758430. Nov. 12, 2016 (5 pages).
Reply to EPO Rule 71(3) Intention to Grant in EP App. No. 11758430. Jan. 18, 2016 (5 pages).
USPTO Notice of Allowability and Interview Summary in U.S. Appl. No. 13/821,009, filed Feb. 18, 2016 (6 pages).
International Search Report and Written Opinion in PCT/EP2011/065414. Dec. 20, 2011 (15 pages).

* cited by examiner

METHODS AND APPARATUS FOR PATTERNING PHOTOVOLTAIC DEVICES AND MATERIALS FOR USE WITH SUCH DEVICES

FIELD OF THE INVENTION

The present invention relates to a picosecond laser beam shaping assembly and particularly, but not exclusively, to a picosecond laser beam shaping assembly for shaping a picosecond laser beam which is used in patterning (e.g., scribing) photovoltaic devices. The present invention also relates to a method of spatially shaping a picosecond laser beam which is output from a fibre laser, for use in the patterning of photovoltaic devices.

BACKGROUND OF THE DISCLOSURE

Thin film photovoltaic solar panels are generally used to harvest solar radiation to produce electricity and typically comprise a plurality of thin films of material deposited on a sheet of glass. The panels may comprise an effective panel area of several square meters, in which case, a panel with a 15% efficiency which receives 1000 W/m$^2$ will generate several hundred Watts of electrical power. In situations where the operating voltage is 0.6V, this would relate to an operating current of several hundred amperes, and thus generate unacceptable resistive losses in the relatively thin conductive films. As a result, it is common to divide or scribe the panel into individual devices having a width of only a few hundred microns, to reduce the effective area and thus reduce the current flowing in each device. The individual devices can then be electrically connected in series, and electrical power extracted at higher voltage and reduced current, thereby significantly reducing resistive losses.

Referring to FIG. 1 of the drawings, thin film photovoltaic devices are commonly formed by depositing a layer of transparent conductive oxide (TCO) 11 such as tin oxide or tin doped indium oxide, upon a glass sheet (FIG. 1a) 10. The TCO layer 11 is subsequently scribed to create strips 11a of TCO which extend across the glass sheet (FIG. 1b). This scribe is commonly referred to as a P1 scribe. Once the P1 scribe has been performed a radiation absorbing layer 12, such as amorphous silicon (a-Si) is deposited upon the TCO strips 11a and within the grooves 11b between the TCO strips 11a formed by the scribe (FIG. 1c). The a-Si layer 12 is subsequently scribed to form strips 12a which similarly extend across the glass sheet 10, and which are separated by grooves 12b which terminate on the TCO strips. This is commonly referred to as a P2 scribe (FIG. 1d). The P2 scribes formed in the a-Si layer are arranged parallel to the P1 scribes, but displaced laterally across the sheet, from them.

Following the P2 scribe through the a-Si layer, a metal layer 13 is deposited upon the a-Si layer and serves as a device back contact (FIG. 1e). The back contact 13 may be formed using silver, gold, copper, titanium, aluminium, indium, platinum or similar metals and/or their alloys. The back contact layer 13 is subsequently scribed to form strips 13a which are separated by grooves 13b, which extend through the a-Si layer to the TCO layer (FIG. 10. This is commonly referred to as a P3 scribe. The P3 scribes are formed substantially parallel to the P1 and P2 scribes but laterally displaced across the sheet, from them. P3 scribes typically involve removal of both radiation absorbing material as well as back contact material. A final scribe process, namely the so-called isolation scribe, may then be employed to electrically isolate the separate devices on the panel.

The P1 scribing process is typically performed using laser pulses from Q-switched mode-locked diode pumped solid state lasers, operating at 1064 nm with pulsewidths in the range of 10 ns to 200 ns and pulse repetition frequencies in the range of 50-150 kHz. Unfortunately, as those skilled in the art will recognize, nanosecond laser scribing of TCO materials employed in a-Si photovoltaic devices typically suffers from substantial heating and related micro-cracking which can compromise device performance, leading to premature device failure and consequently a higher unit price per device.

Mode-locked, diode pumped solid state lasers are well-known in the art for producing relatively high output powers with pulse widths less that 15 ps. The reduced pulse duration is found to reduce the heating of the TCO; however, such lasers typically produce a very narrow pulsewidth range due to the limitations of the mode-locking methods employed to generate the picosecond seed pulses produced by the oscillators in these devices. Furthermore, as is well known to those skilled in the art, substantially varying the pulse repetition frequency typically produces large variations in the key operating characteristics of the laser, such as beam propagation values and pulse stability, both of which can be very important in laser scribing, especially in a production setting.

Picosecond mode-locked diode pumped solid state lasers typically contain many free-space coupled optics, which are difficult to maintain in proper alignment. Furthermore, such laser systems are known to be relatively expensive in comparison to nanosecond diode pumped solid state lasers and their cost remains a barrier to wide industrial application.

Numerous workers have described the prior art employment of fixed pulsewidth nanosecond pulses employing Gaussian optics for laser processing of specimen films employed in a-Si photovoltaic devices. U.S. Pat. No. 4,292,092 describes employment of pulsed output from a Q-switched Nd:YAG laser emitting at 1064 nm for the formation of P1, P2, and P3 scribes. More recently, in "Recent Advances in Laser Scribing Process Technologies for Thin Film Solar Cell Manufacturing," Bonse et al describe employment of a 1064 nm Spectra-Physics HIPPO Model H10-106Q diode-pumped Q-switched Nd:YVO$_4$ laser to produce a 40 µm wide scribe in an indium tin oxide P1 layer by employing an 18 ns pulse, 20 W average laser power output at a pulse repetition frequency of 80 KHz (250 µJ/pulse) at a scribing speed of about 1.25 m/s. Bonse also describes producing 38 µm P2 scribe widths in 220 nm thick a-Si layer, by employing 532 nm, 35 ns pulsed output at pulse repetition frequency of 60 KHz from a diode-pumped Q-switched frequency doubled Nd:YVO$_4$ Spectra-Physics Explorer laser, at scribing speeds ranging from about 0.9 m/s to about 1.9 m/s.

SUMMARY

In accordance with the present invention as seen from a first aspect, there is provided a picosecond laser beam shaping assembly for shaping a picosecond laser beam for use in patterning photovoltaic devices, the assembly comprising:
  a pulsed fibre laser for generating picosecond laser pulses;
  a harmonic conversion element for converting laser pulses at a first laser wavelength having a first spectral bandwidth to laser pulses at a second laser wavelength at a second spectral bandwidth; and,
  at least one beam shaping element for shaping the laser beam at the second laser wavelength,
wherein the second spectral bandwidth is at least as narrow as a spectral bandwidth of the at least one beam shaping element, to produce a laser beam having a substantially rectangular cross-sectional intensity profile.

The incorporation of a harmonic module in the assembly of the present invention produces a second laser wavelength with a spectral bandwidth which has improved spectral matching to the beam shaping elements, compared with the first laser wavelength. As a result the assembly provides for a more uniform intensity profile across the beam, compared with that which would be obtained with the first laser wavelength, and thus an improved scribe in photovoltaic device materials, by minimizing interlayer mixing and heating, in addition to improved side wall sharpness of the scribe.

In a preferred embodiment, the second laser wavelength is less than the first laser wavelength and the second spectral bandwidth is less than the first spectral bandwidth. Typically the first spectral bandwidth is larger than the spectral bandwidth of the at least one beam shaping element.

"Patterning", as used herein, refers to a structural modification (e.g., removal of material) of the material being patterned. Patterning can occur, for example, via an ablative process and can include, but is not limited to, processes such the scribing typically employed in the processing of thin film photovoltaic devices (e.g., formation of P1, P2, etc.)

The second spectral bandwidth, in comparison to the first spectral bandwidth, is arranged to more closely correspond with the spectral bandwidth of the at least one beam shaping element (i.e., less of the second spectral bandwidth, if any, is in excess of a bandwidth of the at least one beam shaping element, as compared to the first spectral bandwidth, which typically exceeds the spectral bandwidth of the at least one beam shaping element). A pulsed laser beam bandwidth which is less than or equal to the bandwidth of the at least one beam shaping element can be acceptable, and still "corresponds" to the spectral bandwidth of the at least one beam shaping element, as that term is used herein). Accordingly, laser beam shaping can be improved by shaping a pulsed laser beam having the second spectral bandwidth, in comparison with the shaping of a pulsed laser beam having the first spectral bandwidth.

As the skilled worker will understand from the present disclosure, the proper shaping of the laser beam is related to the correspondence between the second spectral bandwidth and the spectral bandwidth of the optical element of the beam shaping apparatus. If the bandwidths do not substantially correspond then the shaped laser beam will not have the desired substantially rectangular intensity profile. Shaping is broadly desirable because the sharp or steep sidewalls can improve scribing as compared to the use of a Gaussian beam having Gaussian sidewalls.

In a further preferred embodiment, the pulsed fibre laser comprises a master oscillator fibre power amplifier which is arranged to generate a first laser wavelength in the range of 0.2 µm to 1.6 µm and more preferably substantially 1 µm, and the second laser wavelength comprises substantially 0.5 µm.

In yet a further preferred embodiment, the picosecond laser pulses comprise a pulsewidth in the range of 0.1 ps to 100 ps and more preferably 1 ps to 50 ps. Other useful ranges include 1 ps to 500 ps; 1 ps to 250 ps; 1 ps to 100 ps and 1 ps to 75 ps. It is noted that ranges for parameters specified herein are to be taken as inclusive of the end points, unless otherwise stated.

In a further preferred embodiment the at least one beam shaping element further comprises an aperture. In a further embodiment, the aperture comprises a substantially rectangular shape. In an alternative embodiment, the aperture comprises a substantially square shape.

In a preferred embodiment, the aperture is spaced from the at least one beam shaping element. The aperture is preferably integrated into a heat sink and is spaced from the at least one beam shaping element.

In a preferred embodiment, the at least one shaping element comprises a diffractive optical element. In a further preferred embodiment, the at least one shaping element comprises a refractive lens.

In a preferred embodiment, the at least one beam shaping element comprises a spectral bandwidth less than 30 nm and more preferably less than 10 nm.

In a further preferred embodiment the assembly further comprises at least one optical lens element for imaging the shaped laser beam at the second laser wavelength onto the photovoltaic device. In an alternative embodiment, the assembly further comprises at least two optical lens elements for imaging the shaped laser beam at the second laser wavelength onto the photovoltaic device.

The at least one or at least two optical elements are preferably arranged to produce a minified image of the substantially rectangular cross-sectional laser beam intensity profile at the second laser wavelength, on the photovoltaic device.

In a preferred embodiment, the shaped laser beam at the second laser wavelength comprises a substantially rectangular cross-sectional shape. In a further preferred embodiment, the shaped laser beam at the second laser wavelength comprises a substantially square cross-sectional shape (whereas to shape, the term "rectangular" is taken to include "square"). In a further preferred embodiment, the shaped laser beam at the second laser wavelength comprises a substantially elliptical cross-sectional shape. In a further preferred embodiment, the shaped laser beam at the second laser wavelength comprises a substantially circular cross-sectional shape.

In a further preferred embodiment the shaped laser beam at the second laser wavelength comprise a fluence at the photovoltaic device in the range of 0.05 J/cm$^2$ to 10 J/cm$^2$, and more preferably in the range 0.1 J/cm$^2$ to 3 J/cm$^2$ and in a further preferred embodiment, in the range 0.2 J/cm$^2$ to 2 J/cm$^2$.

In a further preferred embodiment, the photovoltaic device comprises a thin film photovoltaic device.

In a further preferred embodiment, the photovoltaic device comprises at least one of a layer of amorphous silicon (a-Si), a layer of a nitride of silicon (Si—N), and an oxide of silicon (Si—O).

Typically, the at least one beam shaping element comprises an element that spatially shapes the beam.

In accordance with the present invention as seen from a second aspect, there is provided a method of shaping a picosecond laser beam for use in patterning photovoltaic devices, the method comprising:

passing picosecond laser pulses generated from a pulsed fibre laser source at a first laser wavelength and comprising a first spectral bandwidth, to a harmonic conversion element, to convert the laser pulses at the first laser wavelength to laser pulses at a second lasing wavelength comprising a second spectral bandwidth; and, passing the laser pulses at the second laser wavelength to at least one shaping element having a further spectral bandwidth, which is at least as wide as the second spectral bandwidth, to produce a laser beam having a substantially rectangular cross-sectional intensity profile.

In a preferred embodiment, the method further comprises programming the picosecond laser source to tailor the laser beam shape at the second laser wavelength for a particular scribe pattern.

In yet a further preferred embodiment, the method comprises the shaping of a picosecond laser beam in scribing layers of a thin film photovoltaic device.

Further preferred embodiments of the invention of the method of shaping a picosecond laser beam of the second aspect may comprise one or more of the embodiments of the picosecond laser beam shaping assembly of the first aspect.

In accordance with the present invention as seen from a third aspect, there is provided a semiconductor patterning assembly comprising:
- a pulsed fibre laser for generating picosecond laser pulses;
- a harmonic conversion element for converting laser pulses at a first laser wavelength comprising a first spectral bandwidth to laser pulses at a second laser wavelength comprising a second spectral bandwidth;
- at least one shaping element for shaping the laser beam at the second laser wavelength,
- at least one imaging element for imaging the shaped laser beam comprising laser pulses at the second laser wavelength onto the semiconductor to scribe the semiconductor;

wherein the second spectral bandwidth is at least as narrow as a spectral bandwidth of the at least one shaping element to produce a laser beam having a substantially rectangular cross-sectional intensity profile.

Preferred embodiments of the invention of the semiconductor scribing assembly of the third aspect may comprise one or more of the embodiments of the picosecond laser beam shaping assembly of the first aspect.

In accordance with the present invention as seen from a fourth aspect, there is provided a semiconductor patterning process, comprising:
- passing picosecond laser pulses generated from a pulsed fibre laser source at a first laser wavelength comprising a first spectral bandwidth, to a harmonic conversion element, to convert the laser pulses at the first laser wavelength to laser pulses at a second lasing wavelength comprising a second spectral bandwidth; and,
- passing the laser pulses at the second laser wavelength to at least one shaping element having a further spectral bandwidth, which is as least as wide as the second spectral bandwidth, to produce a laser beam having a substantially rectangular cross-sectional intensity profile; and,
- imaging the shaped laser beam comprising the laser pulses at the second laser wavelength using an imaging element onto the semiconductor, to pattern the semiconductor.

Preferred embodiments of the invention of the semiconductor scribing process of the fourth aspect may comprise one or more of the embodiments of the picosecond laser beam shaping assembly of the first aspect as well as one or more of the embodiments of the other earlier described aspects.

In accordance with the present invention as seen from a fifth aspect, there is provided a picosecond laser beam shaping assembly for use in patterning photovoltaic devices, the assembly comprising:
- a pulsed fibre laser for generating picosecond laser pulses in a wavelength range of 500-550 nm;
- at least one shaping element for shaping the laser beam.

In a preferred embodiment, the wavelength of the laser pulses is in the range of 520-540 nm and more preferably 532 nm.

Further preferred embodiments of the picosecond laser beam shaping assembly of the fifth aspect may comprise one or more of the embodiments of the picosecond laser beam shaping assembly of the first aspect as well as one or more of the embodiments of the other earlier described aspects.

In accordance with the present invention as seen from a sixth aspect, there is provided a method of shaping a picosecond laser beam for use in scribing photovoltaic devices; the method comprising:
- passing picosecond laser pulses generated from a pulsed fibre laser source in a wavelength range 500-550 nm to a shaping element for shaping the laser beam.

Preferred embodiments of the method of shaping a picosecond laser beam of the sixth aspect may comprise one or more of the embodiments of the earlier described aspects, including, for example, one or more of the embodiments of the picosecond laser beam shaping assembly of the fifth aspect and/or one or more of the embodiments of the picosecond laser beam shaping assembly of the first aspect.

In accordance with the present invention as seen from a seventh aspect, there is provided a method for laser processing of a selected target layer or layers of a photovoltaic structure to selectively remove target material from the selected target layer or layers, the selected target layer or layers separately comprising an upper surface and a lower surface defining a layer thickness therebetween, at least one of the upper and lower surfaces being arranged in contacting engagement with a surface of a non-target region, the method comprising:
- providing a target layer or layers for use in a photovoltaic structure, the target layer or layers comprising the selected target material and the selected target material;
- delivering a pulsed laser beam to the selected target layers of layers to remove the selected target material; wherein the laser beam comprises a wavelength in the range of 500-555 nm, a pulse width in range of 0.1 ps to 100 ps, a pulse repetition rate in the range of 100 kHz to 500 kHz, and a fluence in the range of 0.1 J/cm2 to 10 J/cm2; and wherein the laser beam can substantially remove the target material so as to expose at least part of the surface of the non target region and effect such removal without appreciably detrimentally affecting the exposed surface as regards the functionality of the photovoltaic structure.

In a preferred embodiment, the selected target material comprises at least one of a nitride of silicon, an oxide of silicon, or amorphous silicon.

Further embodiments of the method of the seventh aspect may comprise one or more of the embodiments of the inventions defined in one or more of the above-mentioned aspects. For example, the pulse width can be in the range 1 ps to 100 ps, or 1 ps to 50 ps, as opposed to the broader range recited above. As another example, the fluence can be in the range of 0.1 J/cm$^2$ to 3 J/cm$^2$.

In accordance with the present invention as seen from an eighth aspect, there is provided a laser-based processing method for laser processing of a selected target layer or layers of a photovoltaic structure to selectively remove target material from the selected target layer or layers, comprising:
- delivering a pulsed laser work beam to the selected target layer or layers for removing the selected target material, the delivery including:
  - (a) providing a master oscillator fiber power amplifier that provides laser pulses having a time duration in the picosecond range, a first fundamental wavelength and a first spectral bandwidth having a first magnitude;
  - (b) providing harmonic conversion with a harmonic converter optically downstream of the fibre power amplifier, to form laser pulses having a second fundamental wavelength that is a harmonic of the first fundamental wavelength, a time duration in the picosecond range and a second spectral bandwidth having second magnitude which is different to the first spectral bandwidth; and
  - (c) providing spatial beam shaping, optically downstream of the harmonic converter, using at least one beam shaping element to provide a laser beam having substantially rectilinear cross-sectional shape and a substantially uniform intensity distribution, the at least one beam shaping element having a third spectral bandwidth having a third magnitude, and wherein the second spectral bandwidth is more compatible with the third spectral bandwidth than the first spectral bandwidth in that there is provided improved spatial beam shaping relative to if a beam having first spectral bandwidth were to be shaped; and wherein the laser work beam comprises a wavelength in the range of 500-555 nm, a pulse width in the range of 0.1 to 100 ps, a pulse repetition rate in the range of 100 to 500 kHz, and a fluence in the range of 0.1 J/cm$^2$ to 10 J/cm$^2$.

Further embodiments of the method of the foregoing aspect may comprise one or more of the embodiments of the inventions defined in one or more of the above-mentioned aspects.

BRIEF DESCRIPTION OF THE DRAWINGS

Embodiments of the present invention will now be described by way of example only and with reference to the accompanying drawings, in which:

FIG. 10b illustrates a spatial beam profile of beam having a substantially Gaussian spatial profile and used for scribes of CdTe for comparison with the beam of FIG. 10a;

DETAILED DESCRIPTION

Figure 2:
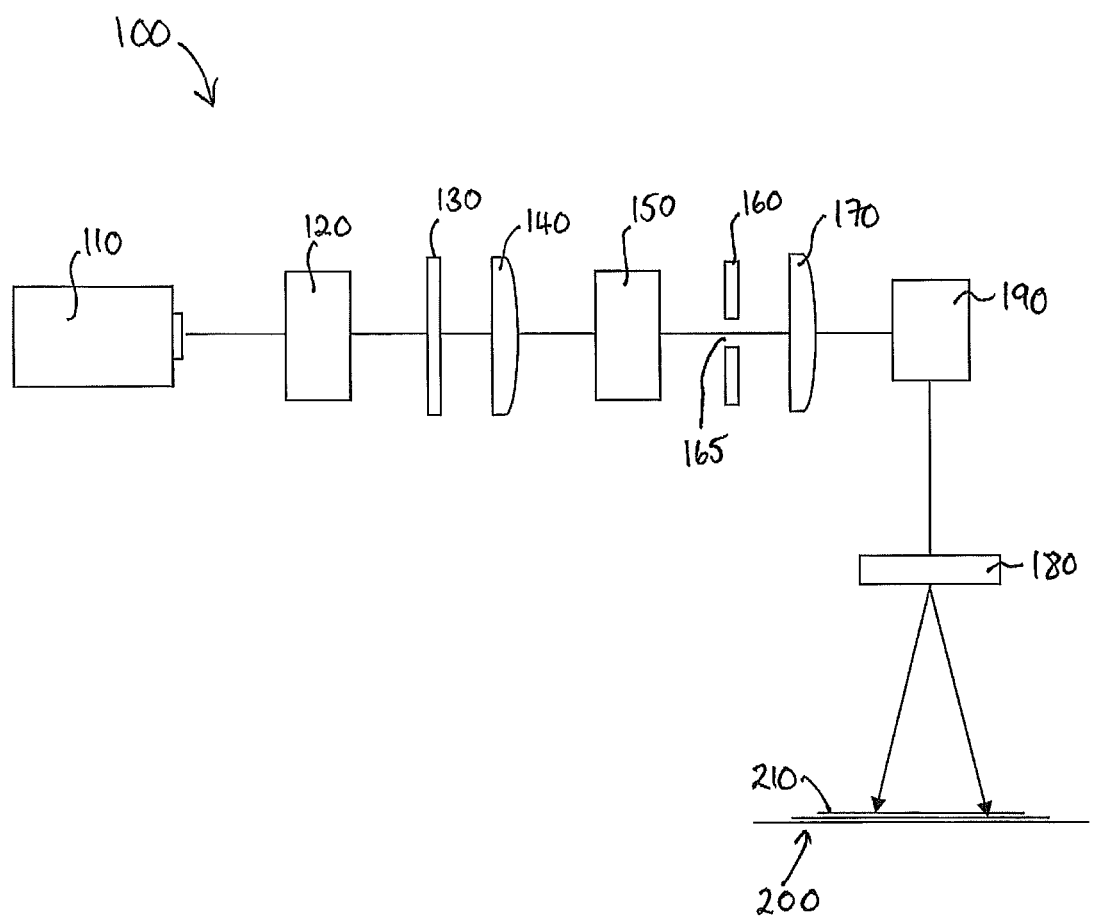
FIG. 2 is a schematic illustration of a picosecond laser beam spatial shaping assembly according to a first embodiment of the present invention; and, FIG. 3 is a schematic illustration of a picosecond laser beam spatial shaping assembly according to a second embodiment of the present invention.

Referring to FIG. 2 of the drawings, there is illustrated a laser beam shaping assembly 100 according to a first embodiment of the present invention for shaping a picosecond laser beam which is used to pattern a photovoltaic devices 200 (e.g., scribe thin film photovoltaic devices), including patterning regions comprising amorphous silicon (a-Si), silicon nitride, silicon oxide or cadmium telluride. The assembly 100 comprises an ultrafast fibre laser, which is arranged to generate laser pulses with a pulse repetition frequency in the range of 10 kHz to 100 MHz and more preferably 100 kHz to 500 kHz. The laser may comprise a diode-pumped ultrafast master oscillator fibre power amplifier (UFMOFPA) 110, or alternatively a diode-pumped flexible ultrafast master oscillator fibre power amplifier, both of which are arranged to generate a fundamental laser wavelength in the range 0.2 μm to 1.6 μm and most preferably substantially 1 μm, and picoseconds laser pulses with a pulse within the range 0.1 ps to 100 ps, or 1 ps to 100 ps, and more preferably 1 ps to 50 ps. Other useful pulse widths ranges include 1 ps to 500 ps; 1 ps to 250 ps; 1 ps to 100 ps and 1 ps to 75 ps. The lower limit in the foregoing ranges can be below 1 ps, such as, for example 0.1 or 0.5 ps. Generally speaking, pulsewidths 0.1 ps or greater or 1 ps or greater can be of interest.

The fundamental laser output from the UFMOFPA laser 110 comprises a substantially Gaussian $TM_{01}$ single spatial mode and is characterized by an $M^2$ value of less than 2.0, with a most preferred value of less than 1.3. The fundamental UFMOFPA laser output mode is further characterized by a fundamental spectral fullwidth-at-half-maximum (FWHM) bandwidth $\Delta\lambda_F$, where $\Delta\lambda_F$>1 nm. As those skilled in the art will recognize however, the fundamental spectral bandwidth of an UFMOFPA is substantially larger than that typically produced by a mode-locked diode-pumped solid state laser (not shown) or a Q-switched diode-pumped solid state laser (not shown) comprising a Nd:YAG, Nd:YLF, or Nd:YVO$_4$ solid state medium, as commonly employed in industrial pulsed solid state lasers.

The output from the UFMOFPA 110 is optically coupled into a harmonic conversion module 120 which is arranged to produce a second harmonic laser wavelength, comprising a substantially Gaussian spatial profile having a FWHM $\Delta\lambda_{SH}$, which is substantially less than $\Delta\lambda_F$. In the embodiment illustrated in FIG. 1 of the drawings, the laser wavelength output from the harmonic conversion module 120 is substantially 0.5 μm and this is optically coupled to beam conditioning elements 130, 140, which are arranged to cooperate to generate a substantially Gaussian beam waist diameter, before passing the beam to a beam shaping apparatus, which can comprise one or both of first and second beam shaping elements 150, 160. The beam shaping apparatus can comprise a beam shaping element having a spectral bandwidth that substantially corresponds with $\Delta\lambda_{SH}$ or wherein $\Delta\lambda_{SH}$ is at least as narrow as the spectral bandwidth of at least one beam shaping element. In other words, the spectral bandwidth of at least one beam shaping element is greater than or equal to $\Delta\lambda_{SH}$.

The first beam shaping element 150 comprises diffractive optical element, such as the TH-034-Q-Y-A diffractive optical element produced by Holo-Or Ltd of Rehovot, Israel, which is arranged to re-shape the beam having a substantially Gaussian cross-sectional intensity profile, to form a substantially rectangular cross-sectional intensity profile, having a substantially uniform intensity profile across the beam. In an alternative embodiment, the first beam shaping element may comprise a refractive optical element, such as the pi-shaper 6_6_532/1064 model as produced by MolTech GmbH of Berlin, Germany. The intensity profile comprises a rapid fall off at the sides of the beam, and a peak-to-trough ripple across the beam of less than 10% of the average beam intensity, and more preferably less than 5%.

The second beam shaping element comprise a rectangular aperture 165 machined into a ceramic aperture element and which is further mounted in a heat sink 160. Heat sink 160 is preferably formed of copper or other high thermal conductivity materials, such as Molybdenum. The aperture 165 disposed within the second beam shaping element 160 comprises a cross-sectional dimension within the range 60 µm×60 µm to 150 µm×150 µm, and typically comprises a dimension of 90 µm×90 µm. In the preferred embodiment, the aperture comprises a 100 µm×100 µm aperture 165 disposed within a 9.5 mm alumina ceramic disc mounted within a heat sink 160, such as that produced by Lenox Laser of Glen Arm, Md., USA.

The diffractive optical element 150 is arranged to produce a substantially 100 µm×100 µm square cross-sectional beam shape at a distance z along the beam path and the heat sink 160 comprising the aperture 165 is separated from the diffractive optical element 150 by the distance z, such that the square beam waist generated by the diffractive optical element substantially coincides with the position of the aperture 165 in the heat sink 160.

The beam exiting the aperture 165 is subsequently coupled to a first and second imaging lens 170, 180 via a beam steering arrangement 190 disposed between the first and second lens 170, 180. The lenses 170, 180 are arranged to produce a minified image of the shaped beam on the surface 210 of the semiconductor photovoltaic device 200. In the embodiment illustrated in FIG. 2, the first imaging lens 170 comprises a focal length of 250 mm and the second imaging lens 180 comprises a focal length of 100 mm, such that the combination is arranged to produce a minified image at the semiconductor surface 210 of substantially x0.4

In alternative embodiments, the focal length of first lens may be in a range from about 50 mm to about 500 mm and the focal length of the second lens may be in a second range of about 50 mm to 300 mm. As those skilled in the art will recognize, such a range of respective first and second focal lengths may provide an advantageous range of image minification. Those skilled in the art will recognize that the first lens may be a single or multi-element lens and that the second Imaging lens is preferably a multi-element lens. In one embodiment, the second imaging lens is a telecentric scan lens.

Figure 3:
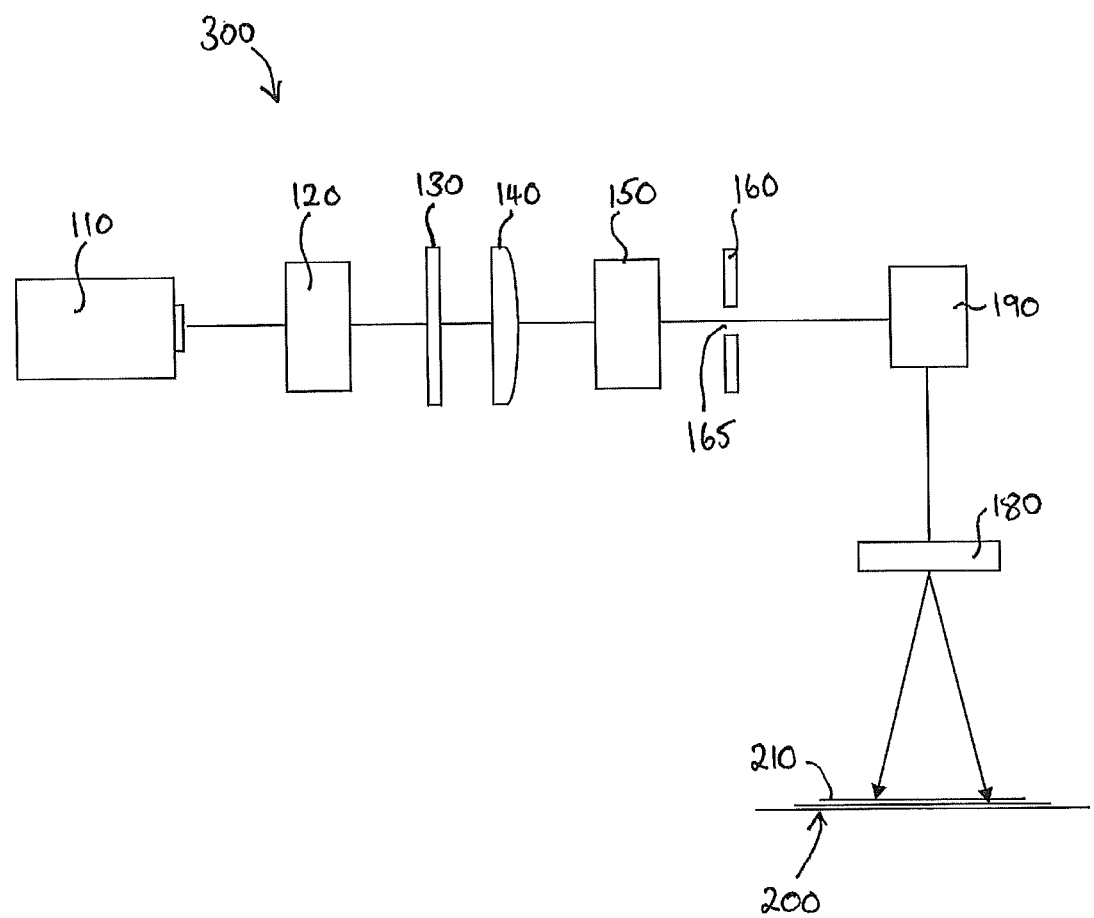

Referring to FIG. 3 of the drawings, there is illustrated a laser beam shaping assembly 300 according to a second embodiment of the present invention for shaping a picosecond laser beam which is used to scribe semiconductor photovoltaic materials, such as a-Si associated with photovoltaic devices 200. The assembly 300 of the second embodiment is substantially the same as the assembly of the first embodiment (and so like features have been referenced using the same numerals), but the first imaging lens 170 has been removed. In this embodiment, the laser beam is imaged onto the semiconductor photovoltaic surface 210 using the second imaging lens 180 but not the first imaging lens, and the second imaging lens may comprise a telecentric lens or alternatively a multi-element objective lens. In both embodiments, the UFMOFPA 110 may be programmable to produce specific shaped beam serriform laser output characteristics to suit a particular scribing, drilling and/or patterning process, which is found to afford improved process flexibility at reduced overall installed system cost to manufacturers.

Figure 4:
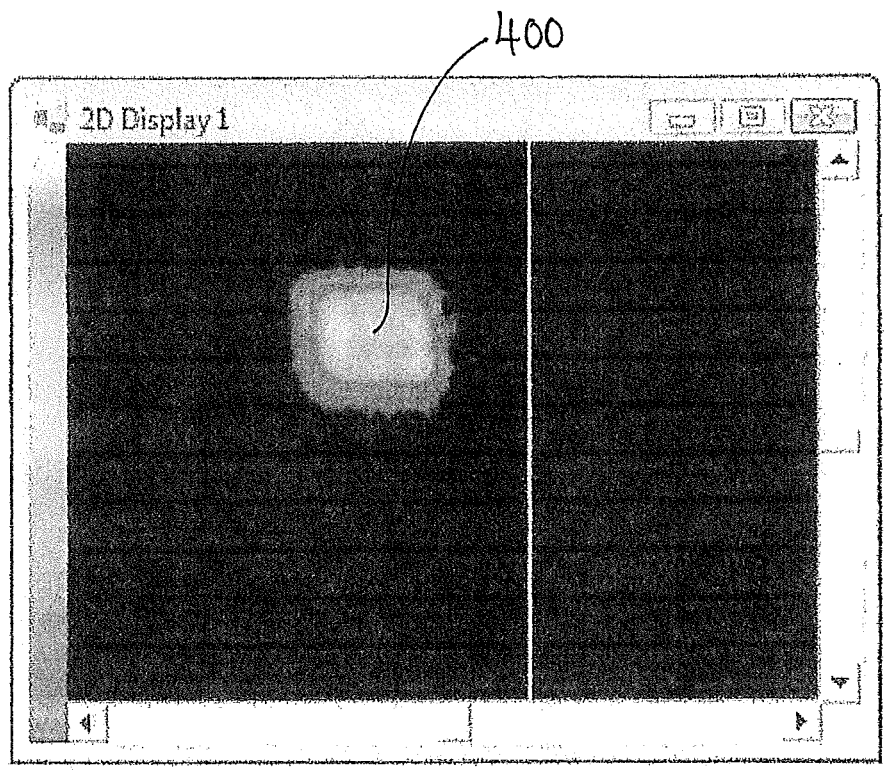
FIG. 4 is cross-sectional view of a square shaped laser beam from a UFMOFPA.
Figure 5:
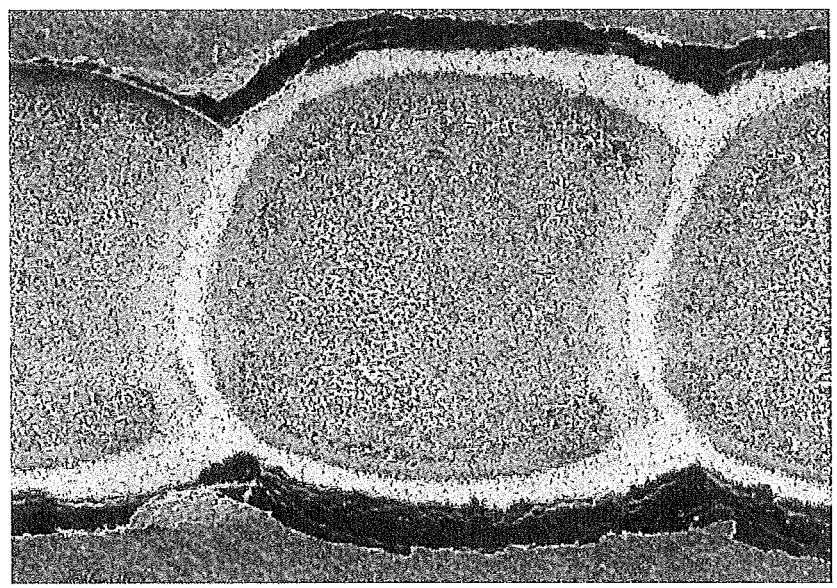
FIG. 5 is a scanning electron microscope image of an a-Si P2 scribe produced by shaped beam UFMOFPA.
Figure 6:
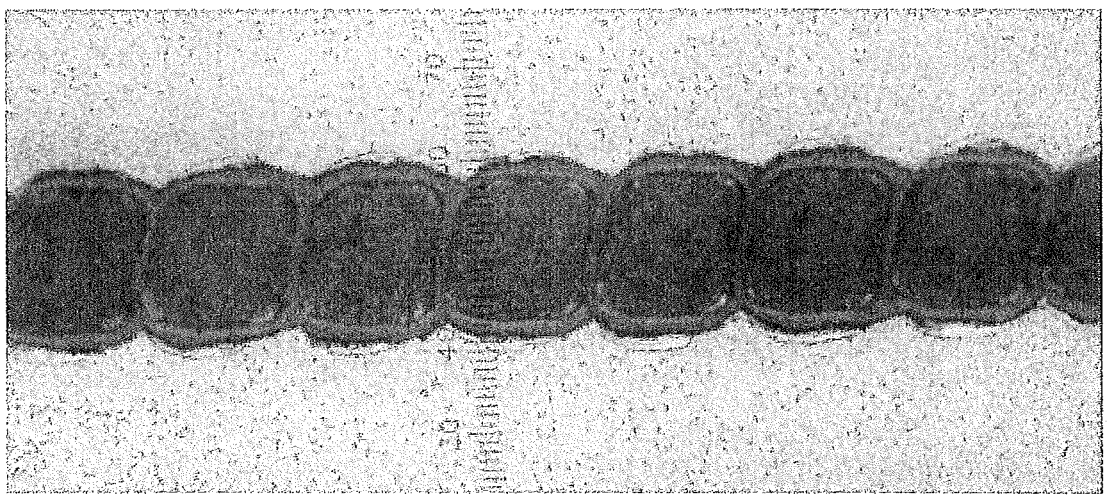
FIG. 6 is a microphotograph of the a-Si P2 scribe illustrated in FIG. 5, taken with an optical microscope at 500× magnification.
Figure 7:
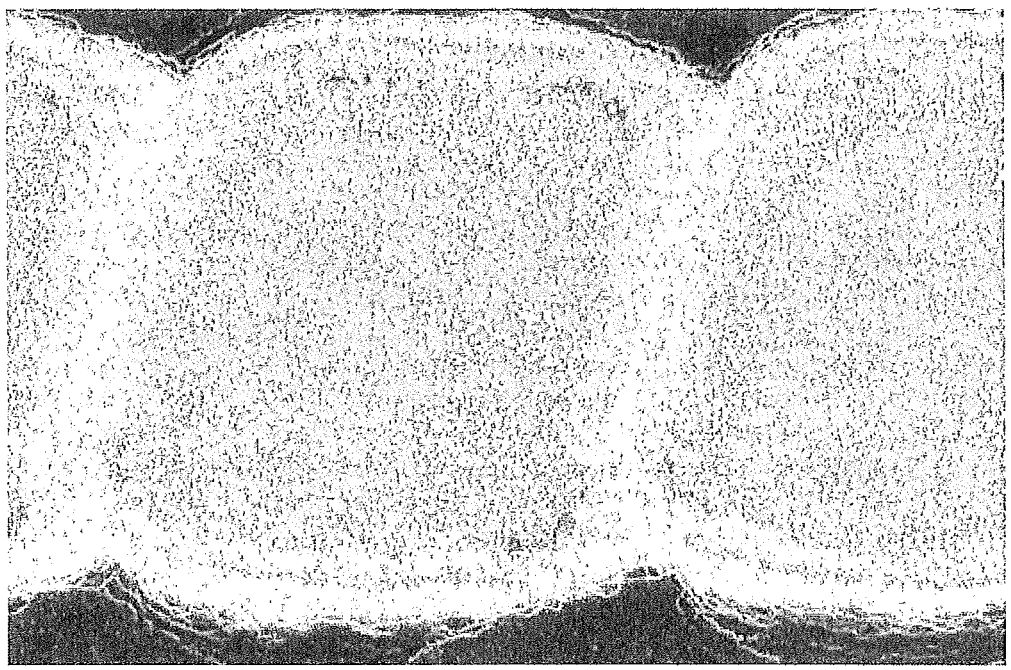
FIG. 7 is a scanning electron microscope image of an a-Si P3 scribe produced by shaped beam UFMOFPA.
Figure 8:
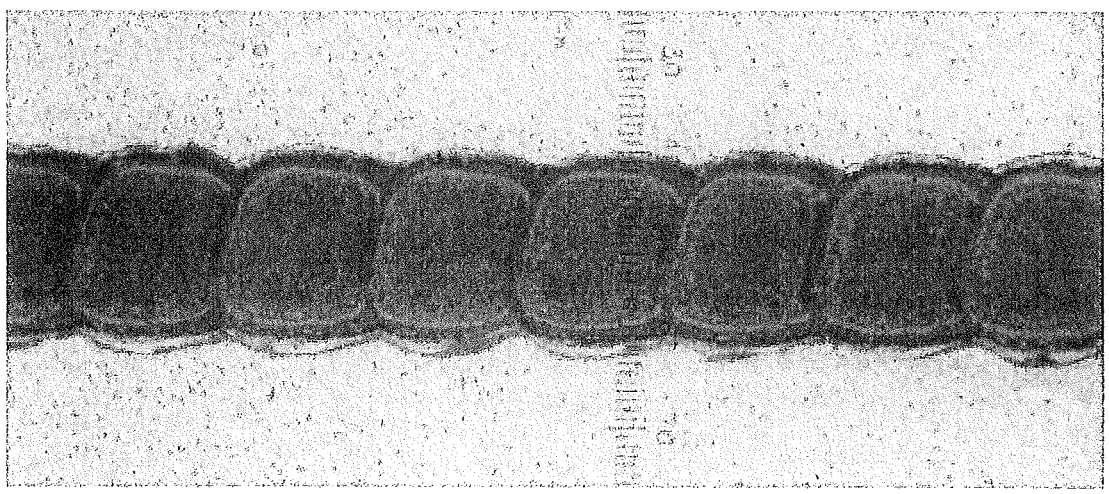
FIG. 8 is a microphotograph of the a-Si P3 scribe illustrated in FIG. 7, taken with an optical microscope at 500× magnification.

Referring to FIG. 4 of the drawings, there is illustrated a sectional view across a minified laser beam output from a Fianium Model HE1060/532 UFMOFPA emitting at 0.532 µm, where the beam has been shaped to produce a substantially square beam. The shaped laser beam may be used to perform a P2 scribe, for example, as illustrated in FIGS. 5 and 6 of the drawings, or a P3 scribe, for example, as illustrated in FIGS. 7 and 8 of the drawings. In performing a P3 scribe, namely a scribe through an a-Si layer (not shown) and a metal layer (not shown), the shaped laser beam comprising picosecond laser pulses at a wavelength of substantially 0.5 µm is passed from the glass side (commonly known as a backside pass) of an a-Si thin film photovoltaic device 200 fabricated on a soda lime glass substrate (not shown). As those skilled in the art will appreciate the TCO (not shown) is substantially transparent at 0.5 µm and therefore the shaped beam pulse energy efficiently couples into the a-Si layer (not shown) and substantially ejects through the metal layer, thereby causing the a-Si layer and metal layer to be removed. P2 and P3 scribes such as those shown in FIGS. 5-7 can be formed using 30 picosecond pulses with a 200 kHz pulse repetition rate. The pulse energy can range to about 5 µj. The ablation thresholds for the P2 and P3 scribes can be about 0.14 J/cm$^2$ and 0.16 Jcm$^2$, respectively. The beam can be approximately 40 um on a side (e.g., 37 µm×37 µm) at a work plane (e.g., a worksurface on the device. The P2 and P3 scribes can be made at fluences of about 0.20 µJ/cm$^2$ (0.21 µJ/cm$^2$ and 0.23 µJ/cm$^2$ respectively) and a linear translation speed of, for example, 7000 mm/s or higher.

The beam is scanned across the surface 210 of the device 200 at a linear speed in the range of 2000 mm/s to 6500 mm/s and more preferably substantially 6000 mm/s and the beam pass across the respective layer is performed at a shaped beam fluence value at the device surface 210 which is selected to be above the threshold ablation of the a-Si layer. In some embodiments of the disclosure, the linear speed can range to and above 7000 mm/s, 8000 mm/s, or 9000 mm/s, and it is expected that linear speeds in excess of 10,000 mm/sec can be reached in conjunction with certain processes and materials. In situations where the lasing radiation output from the UFMOFPA 110 comprises a wavelength of approximately 0.53 µm, and the pulses generated therefrom comprise a pulsewidth of approximately 30 ps and a pulse repetition frequency of 200 kHz, the shaped beam ablation threshold of the a-Si layer is found to be substantially 0.1 J/cm$^2$ and so a preferred range for fluence of the minified shaped beam at the a-Si/metal layer surface is 0.2-2.0 J/cm$^2$.

In performing an isolation scribe (not shown) to isolate the separate devices on the glass sheet the output profile of the beam is substantially rectangularly shaped with the dimension transverse to the scribe direction selected to produce the desired isolation scribe first terrace width which may range from 10 µm to 100 µm, and more preferably 40 µm to 80 µm.

The laser beam is shaped using the first and second shaping elements 150, 160 to produce a substantially rectangular profile and the fluence of the individual pulses from the UFMOFPA 110, which may be optionally amplitude modulated, at the device surface 210 range from approximately 0.05 J/cm$^2$ to approximately 10 J/cm$^2$, with a most preferred range comprising 0.1-3 J/cm$^2$. As those skilled in the art will appreciate, due to the relatively thin layer thicknesses, the top and bottom first terrace widths are typically of comparable dimension.

Precise control of the laser processing beam parameters can help avoid undesirable device damage while achieving complete removal of the overlying a-Si (for P2 scribes) or a-Si and back contact metallization layers (P3 scribe) and satisfactorily exposing the TCO layer. The assembly 100, 300 according to the above described embodiments can suitably shape the picosecond pulsed laser beam to form sharp sidewalls of the scribe with minimal interlayer mixing due to melting or other laser process-induced morphology changes between the a-Si layer (and back contact metallization layer for P3 scribing) and the TCO layer. The laser processing assembly of the first and second embodiment 100, 300 can further provide for a picosecond pulsed laser beam which suitably removes the a-Si layers (and back contact metallization layer in the case of P3 scribing) completely along the length of the scribe line, while exposing the TCO layer (not shown) and leaving it substantially intact. Furthermore it is found that the P2 and P3 scribes created using the shaped picosecond pulsed laser beams can minimise micro-cracking and debris re-deposition which may reduce efficiency or device reliability, or cause mechanical dislocations, such as layer dislocation from thermal blistering.

Figure 1:
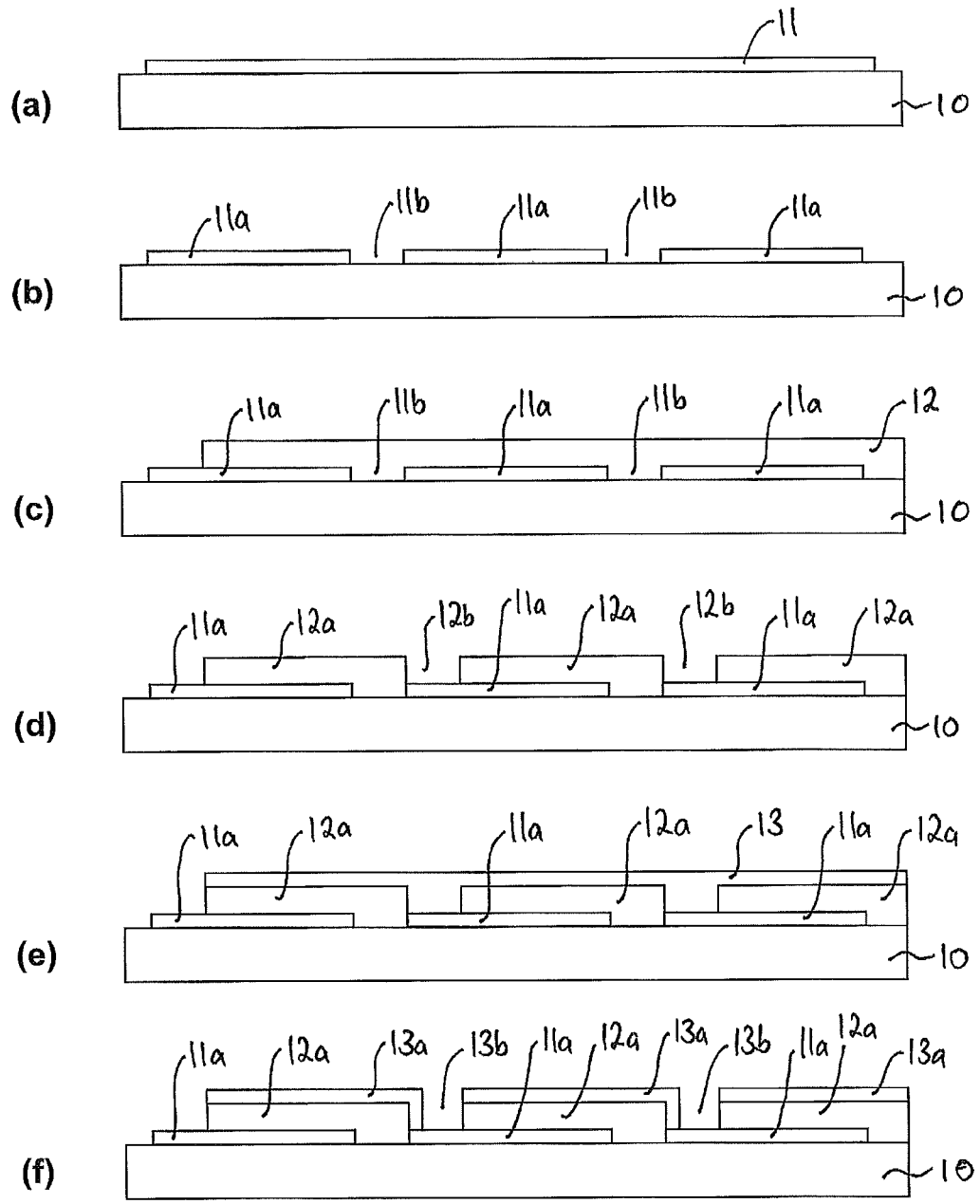
FIG. 1a is a transverse sectional view across a glass sheet comprising a layer of TCO deposited thereon.
FIG. 1b is a transverse sectional view across the glass sheet of FIG. 1a following a P1 scribe.
FIG. 1c is a transverse sectional view across the glass sheet of FIG. 1b, further comprising a layer of a-Si.
FIG. 1d is a transverse sectional view across the glass sheet of FIG. 1c following a P2 scribe.
FIG. 1e is a transverse sectional view across the glass sheet of FIG. 1c further comprising a layer of metal.
FIG. 1f is a transverse sectional view across the glass sheet of FIG. 1e following a P3 scribe.
Figure 9A:
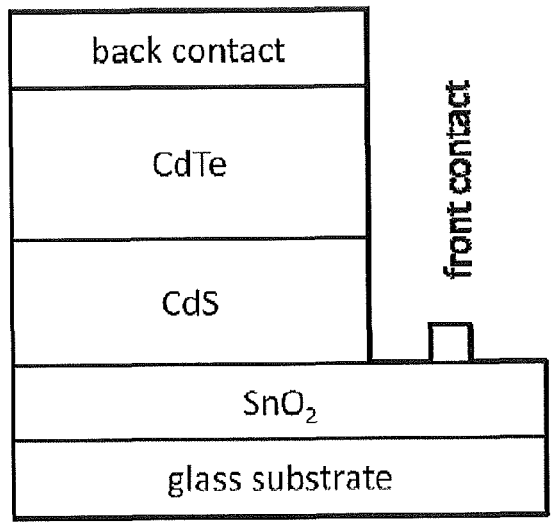
FIGS. 9A and 9B schematically illustrate examples of photovoltaic devices that include CdTe.
Figure 9B:
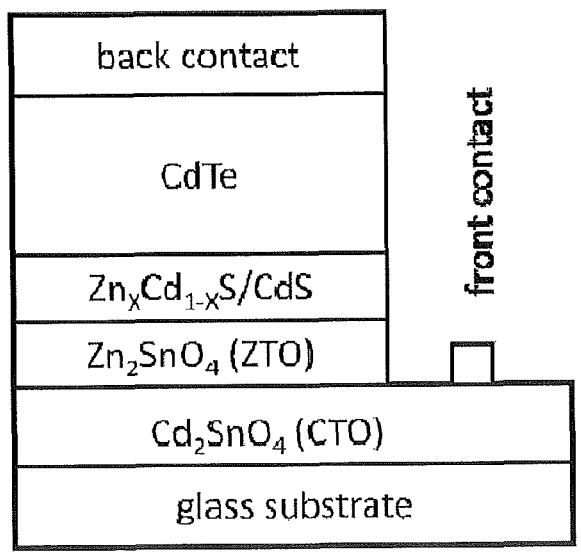

The methods and apparatus described above can also be used to pattern photovoltaic devices comprising cadmium telluride (CdTe). FIGS. 9A and 9B schematically illustrate examples of photovoltaic devices that include CdTe. Sample CdTe photovoltaic devices were prepared and scribed with a scribing apparatus as generally shown in FIG. 1. The CdTe devices were prepared from TCO coated commercial glass (Pilkington Tec15® coated with highly resistive buffer layer). The TCO coated glass was cleaned and then layers of CdS (80-100 nm) and CdTe (2.1 μm) deposited thereon via rf sputtering. The resulting films were wetted with MEOH saturated with CdCl2 and annealed in dry air for 30 minutes at 387° C. Back contacts were evaporated through a mask using a bi-layer of Cu (3 nm) and Au (20 nm). Finally, the devices were annealed at 150° C. for 45 minutes. Devices created in this way have a typical efficiency of 12-13%.

Figure 10A:
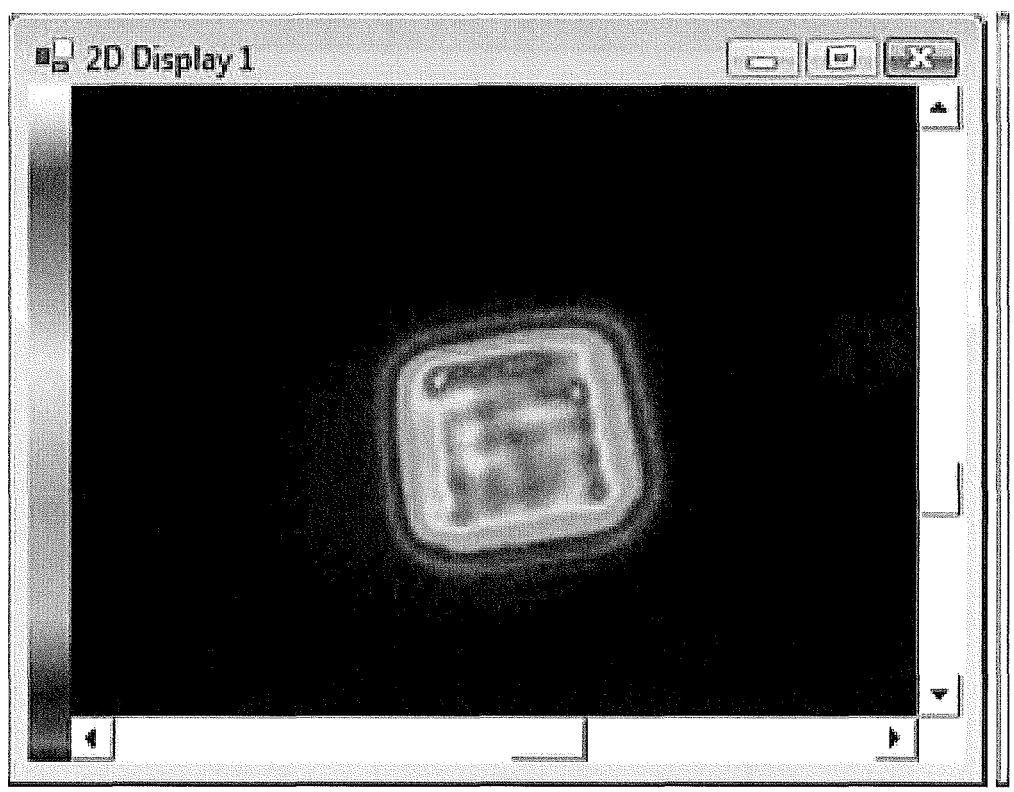
FIG. 10a illustrates a spatial beam profile of a spatially shaped beam having a substantially square spatial profile and used for scribes of CdTe.

FIG. 10a illustrates a spatial beam profile of a spatially shaped beam having a substantially square spatial profile with substantially uniform intensity across the substantial square profile, and is representative of the beam used for scribes of the CdTe samples. The beam of FIG. 10a can be produced using a HoloOr diffractive optic that produces a 100×100 μm square beam profile at a distance of approximately 100 mm behind the optic, where a 90 μm square ceramic aperture is placed at the location of the 100 μm square beam profile to maximize profile edge steepness. The location of this aperture is imaged to infinity by lens at a distance approximately equal to the lens' focal length behind the aperture. A galvanometric scanner system equipped with 100 mm focal length telecentric scan lens then images the square at an appropriate image plane within or on an appropriate surface of the photovoltaic device with a minification factor of about 0.4. The galvonometric scanner system (Scanlab HurrySCAN II-14) can provide high speed, 2D control of image location on the work surface. The spatially shaped square image size at the work surface is approximately 40 μm on a side.

Figure 10B:
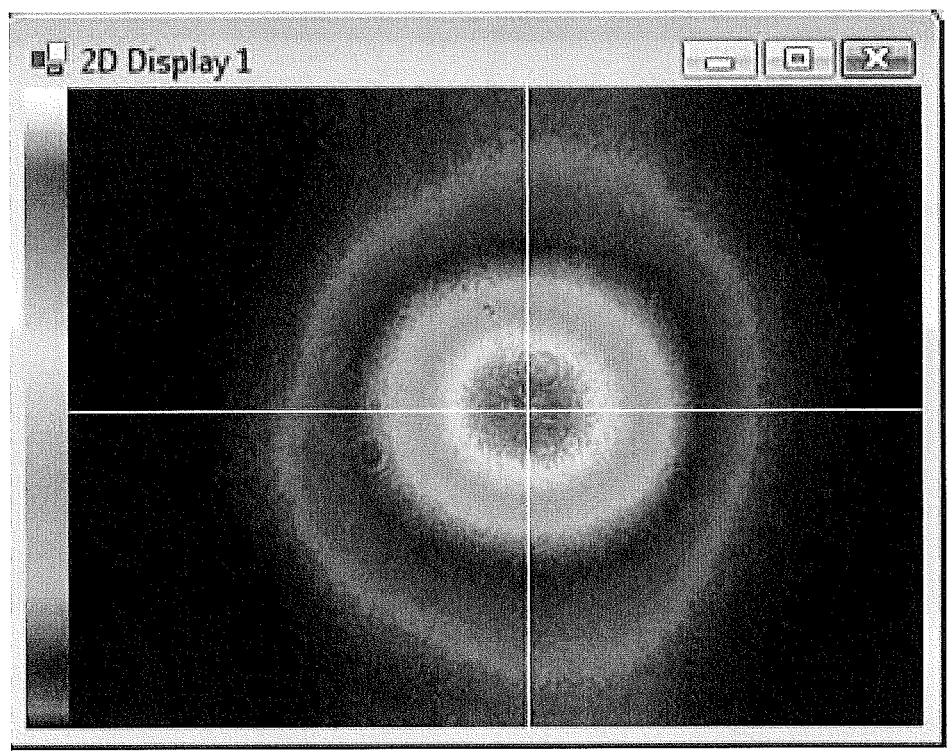

For comparison with the substantially square beam having a substantially uniform square intensity region of FIG. 10a, FIG. 10b illustrates a spatial beam profile of beam having a substantially Gaussian spatial profile.

The substantially square beam profile was imaged to the back surface of the CdTe sample devices fabricated as noted above to create P2 and P3 scribes using a back-side (superstrate) geometry. A first set of scribes was used to determine the threshold for ablation.

Figure 11A:
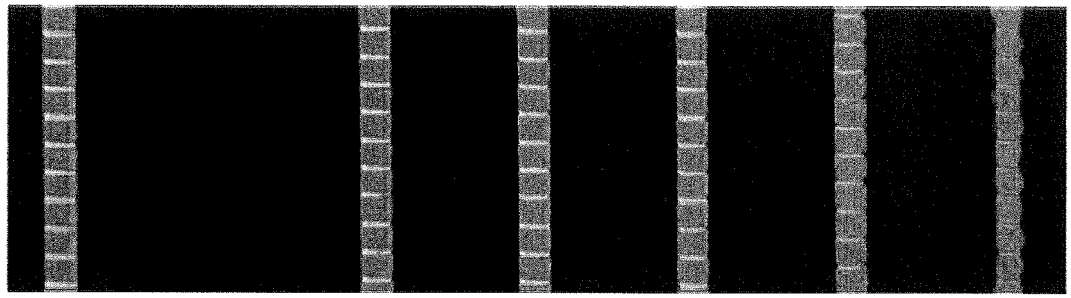
FIG. 11a is a transmission microphotograph of P2 scribes of CdTe made with a substantially square beam.

FIG. 11a shows a transmission microphotograph of P2 scribes on CdTe with the square beam shaping apparatus in accordance with this embodiment. Single pulses are used to scribe the squares, at a speed of 7000 mm/s, with laser pulse repetition rate of 200 kHz and fluences ranging from 0.11-0.23 J/cm$^2$. The ablation threshold for sample P2 substrates is considered to be about 0.11 J/cm$^2$. A lower fluence value results in no visible material modification. The ablation threshold for the P3 substrates was found to be about 0.18 J/cm$^2$. A slightly lower fluence value results in a buckling of the absorber and contact layer but is insufficient to fully remove the material.

Figure 11B:
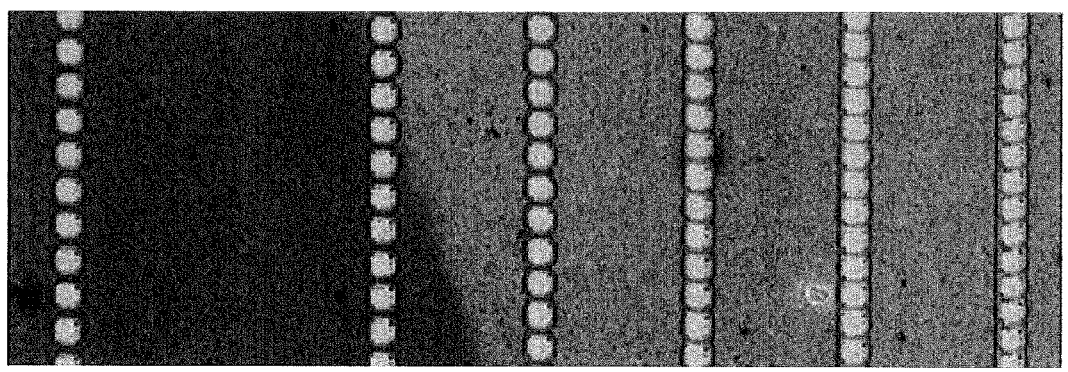
FIG. 11b is a reflection microphotograph of P3 scribes of CdTe made with a substantially square beam.

Linear scribe speed can be an important process parameter. A square beam profile allows the scribe speed relative to spot size to be significantly increased because very little pulse-to-pulse overlap is necessary. The appropriate scribe speed, given the imaged square size of 37×37 μm, is 7000 mm/s for both P2 and P3 scribes. FIG. 11B shows the reflection microphotograph of P3 scribes on CdTe with the substantially square-beam shaping apparatus in accordance with this embodiment. Single pulses are used to scribe the squares, at a speeds ranginess from 6000-9000 mm/s (right to left), with laser pulse repetition rate of 200 kHz and fluences of 0.21 J/cm$^2$. P2 scribes of various speeds were also done and the optimal speed is determined to be as large as 7000 mm/s for a fluence of 0.18 J/cm$^2$.

Figure 11C:
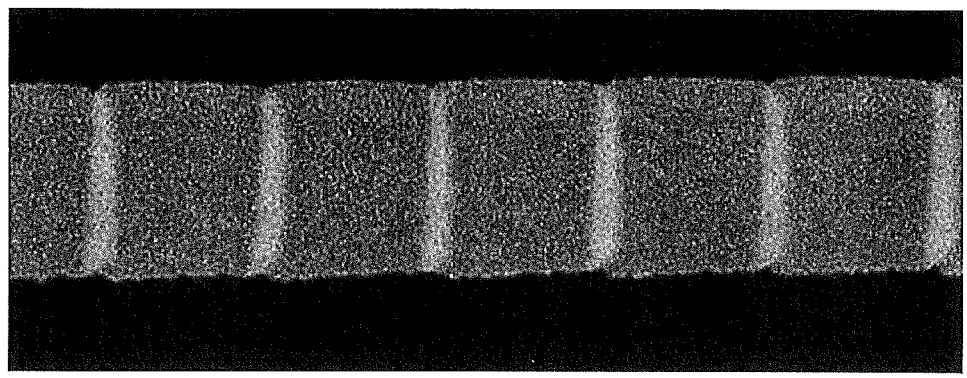
FIG. 11c is a closer view of a scribe of CdTe using a substantially square beam profile.

FIG. 11c is a closer view of a scribe of CdTe using a substantially square beam profile having a substantially uniform intensity with a substantially square region.

Figure 12A:
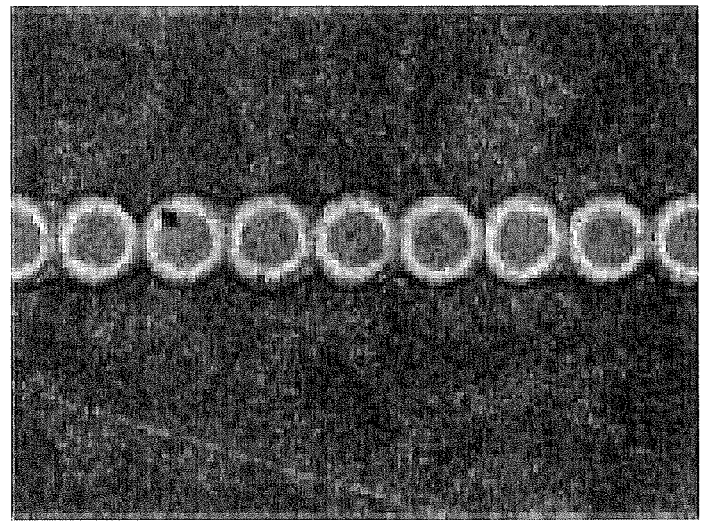
FIG. 12a is a microscope image of a P2 scribe of CdTe substantially spatially Gaussian beam.
Figure 12B:
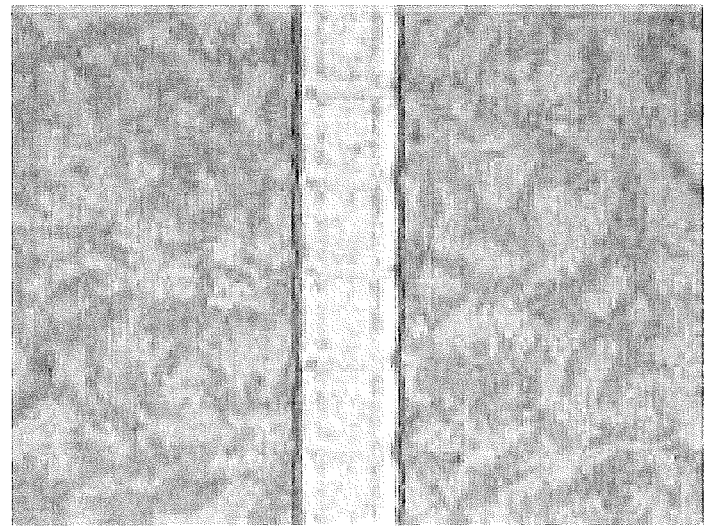
FIG. 12b is a microscope image of a P2 scribe of CdTe with a substantially square beam.

FIG. 12a is a microscope image of a CdTe P2 scribe made with a 20 μm substantially spatially Gaussian beam and FIG. 12b is a microscope image of a CdTe P2 scribe made with a substantially square beam profile having a side length of about 37 μm.

In comparison to the Gaussian beam, the substantially square beam scribes can provide one or more of the following attributes. For example, the scribe edges for the substantially square scribe can be much straighter and thus the scribe width more uniform. Additionally, the more uniform fluence applied to the CdTe sample with the substantially square scribe as compared to the Gaussian scribe can mean less modification or damage to the underlying TCO. Finally, the substantially square profile allows the scribes to have much lower pulse-to-pulse overlap than with a Gaussian beam, so overall linear process rates can be around 20-30% faster for similarly sized beams.

The embodiments noted above typically involve pattering of photovoltaic structures having a "superstrate" configuration. In the "superstrate" configuration the transparent conductive region is typically located between the absorber and the base substrate, such as in FIG. 1, where the transparent conductive material 11 is located between absorber 12 the base glass sheet 10. The techniques described above can also be used for processing photovoltaic devices having the so called "substrate" configuration, where the absorber is between the transparent conductive region and the base. The terminology is understood by those skilled in the art, though it can be confusing initially to the uninitiated because in both cases the base portion can be referred to as a substrate. The superstrate and substrate configurations differ in how they are used to generate electricity responsive to solar radiation: the solar radiation passes through the base substrate in the superstrate arrangement to reach the absorber and does not do so in the substrate configuration, but instead passes through the transparent conductive oxide on the other side of the radiation absorber from the base substrate. Patterning steps for superstrate configuration often involve the transmission of the patterning laser beams through the substrate, whereas steps are more likely to involve patterning through the transparent conductor but not the substrate when processing a photovoltaic device having the substrate configuration.

The above described scribe techniques are also found to be suited for the patterning or structuring of oxides or nitrides of silicon (e.g., silicon nitride) deposited on crystalline silicon, such as, for example, single crystal or polycrystalline silicon. The silicon can be untextured or textured.

In one practice of the invention, SiN is removed, using a 532 nm master oscillator fiber power amplifier. A low ablation threshold value of 0.1 J/cm$^2$ for the silicon nitride was observed when processing at a pulse repetition frequency of 200 KHz and 30 ps pulsewidth. This ablation threshold value is comparable to that previously reported for selective removal of silicon nitride from monocrystalline and polycrystalline silicon using a 355 nm hybrid (fibre-bulk) laser source and is substantially lower than the ablation threshold value reported using a 355 nm Q-switched diode-pumped Nd:YVO$_4$ laser source. More preferably a fluence threshold of approximately 0.4 J/cm$^2$ is used in practice. The nominal imaged beam size at the surface upon which the scribe was to be performed, was a 40 μm×40 μm square image.

However, in other practices of the disclosure, fluence values between about 0.07 and about 0.38 J/cm$^2$ are considered to be useful, yielding a processing window of well over 200%.

The invention can include removing target materials wherein the target materials do not absorb well at the wavelength of the pulses being used. For example, SiN does not absorb well at 532 nm. Accordingly, in one practice of the invention it is removed through a "lift-off" process. In this process a region of SiN$_x$ (or SiO$_x$) can be removed by heating or ablating a region of the underlying crystalline silicon substrate that is adjacent to the SiN$_x$ (or SiO$_x$). For example, the topmost region of underlying substrate having a selected thickness can be removed without substantially affecting performance of a photovoltaic device comprising the crystalline substrate. The selected thickness can be between about 1 and about 40 nm; or between about 1 and about 30 nm, or between about 1 nm and about 20 nm, or between about 1 nm and 10 nm. In some practices, the selected thickness is greater than 10 nm; or greater than 15 nm; or greater than 20 nm, or greater than 30 nm. Typically for the foregoing recitations regarding "greater than", the selected thickness will be less than 100 nm, and in some practices of the invention, less than 50 nm. The laser beam, which as noted above can be substantially rectangular (e.g., have a substantially square shape) can be transmitted through the SiN to remove a region of crystalline silicon adjacent the SiN. The lift off technique can be practiced independent of a specific beam shape and, for example, can use a substantially rectangular beam shape or a beam having a substantially Gaussian spatial profile.

Silicon Nitride (SiN) thin-films are commonly used for antireflection (AR) and passivation coatings for crystalline-silicon solar cells. In many applications it is the preferred coating because of its ability to act with the dual functionality of both passivation and antireflection. For certain advanced cell designs, it is desirable to remove or pattern small areas of the SiN AR/passivation. A single picosecond pulse with 532 nm laser as taught herein can cleanly remove areas of a SiN passivation and anti-reflection coating in excess of 500 μm$^2$. With this single pulse scribe area and using repetition rate up to 1 MHz or even higher, a clearing or patterning rate in excess of 100 mm$^2$/s is achievable. It is considered that the teachings herein can allow for the faster processing of photovoltaic structures, such as the formation of acceptable device scribes at higher linear speeds and/or with less overlap of adjacent scribe segments, especially as compared with prior art techniques using beams having a Gaussian spatial profile.

Figure 13:
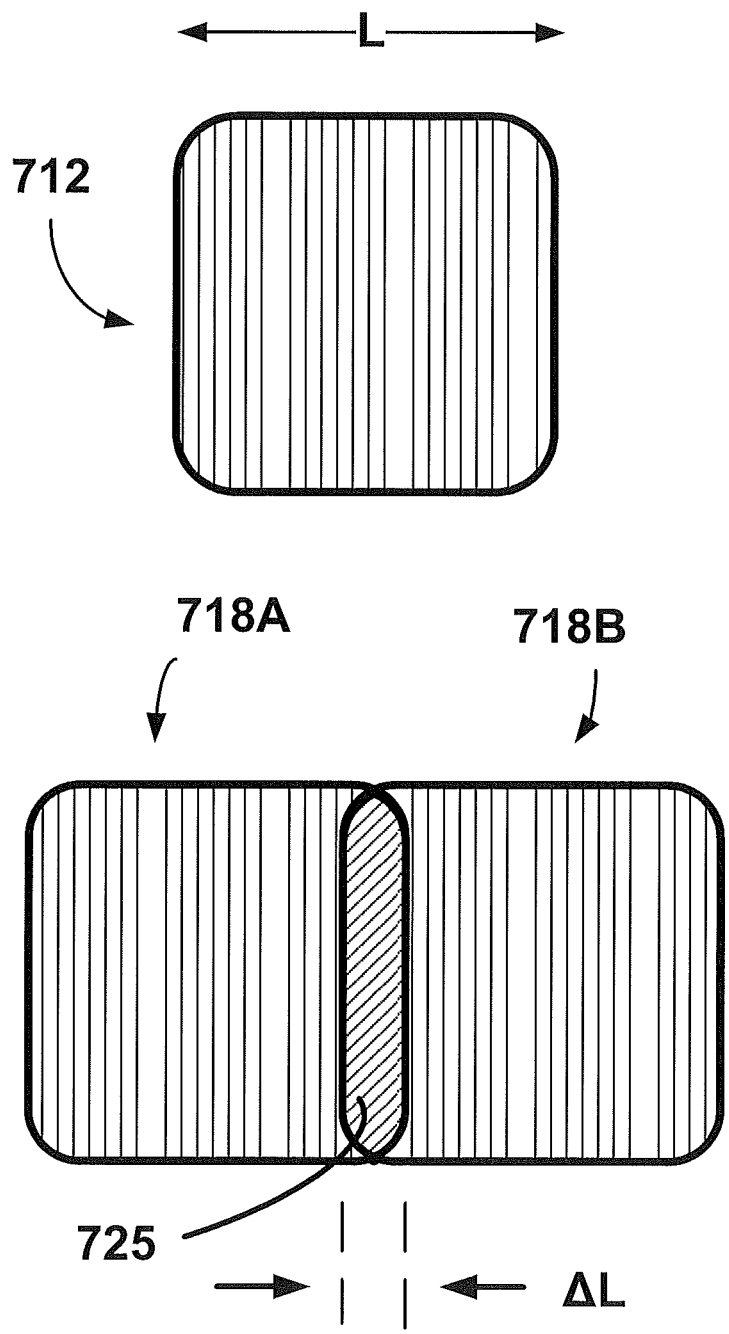
FIG. 13 schematically represents two overlapping scribe segments formed from a laser beam having substantially square shape or profile.

FIG. 13 schematically represents a single scribe segment 712 having sides of length L and formed with a substantially square shaped beam. FIG. 13 also schematically illustrates two overlapping scribe segments, 718A and 718B, also formed from a laser beam having substantially square shape or profile. (In practice scribe segment 718A would also be overlapped on its left side by an adjacent scribe segment and 718B would be similarly overlapped on its right side—for simplicity these are not depicted in figure and in any event do not factor into the determination of the degree of overlap of adjacent sections) One measure of the degree of overlap of adjacent scribe sections is the ratio of the length of overlap area 725 along the scribe line to the length of scribe segment along the scribe line. The ratio can be expressed as a percentage. For the substantially square scribe segments shown in FIG. 13, the overlap, in percent, is approximately ΔL/L×100.

It is considered that the present teachings herein can allow for scribes having good sidewall definition, and the substantially rectangular beams and/or beams having a substantially uniform intensity distribution allow for faster processing speeds with less overlap. Overlap can be detrimental, as it can lead to local melting or heat affected zones being formed.

In the various practices of the embodiments disclosed above, the linear processing speed can be at least 5000 mm/s; or at least 6000 mm/s; or at least 7000 mm/s, or at least 8000 mm/s; or at least 9000 mm/sec. Taken alone or in conjunction with any one of the foregoing recitations regarding linear speed, the overlap between adjacent scribes can be no greater than about 50%; or no greater than 30%; or no greater than 20%; or no greater than 10%; or no greater than 8%, 6%, 5%, 4% or 3%. Thus, for example, one practice of the invention can comprise processing to arrive at a good CdTe scribes at a processing speed of at least 7000 mm/s with an overlap between adjacent scribes of no greater than 10%.

Practical fluence thresholds for processing the photovoltaics materials described herein (e.g., a-Si, SiN$_x$, SiO$_x$, Cd/Te) can be at least about 0.1 J/cm$^2$; at least about 0.2 J/cm$^2$; at least about 0.3 J/cm$^2$; at least about 0.4 J/cm$^2$, or at least about 0.5/cm$^2$. Alone or in combination with any of the foregoing the fluence can be less than about 10 J/cm$^2$; less than about 5 J/cm$^2$; less than about 2.5 J/cm$^2$; less than about 2 J/cm$^2$, or less than about 1 J/cm$^2$. In certain practices, useful fluences range from about 0.1 J/cm$^2$ to about 5 J/cm$^2$ or to about 10 J/cm$^2$. Scribes can be made with a beam having substantially rectangular shape and the foregoing fluence ranges, to produce a scribe line or channel comprised of scribe segments having a length along the scribe channel of at least 20 μm, at least 30μ, or at least 50 μm, wherein the substantially rectangular shaped pulses have a pulse repetition rate of at least 100 kHz, at least 150 kH, at least 200 kHz or at least 250 kHz, or at least 500 kHz, and wherein the overlap of the scribe segments is no greater than about 25%, no greater than about 15%, no greater than about 10%, no greater than about 8%, no greater than about 6%, no greater than about 5%, or no greater than about 4%. The scribe segments can have substantially rectangular shape. A beam from a MOFPA as described below in conjunction with FIGS. 14 and 15 can be spatially shaped to provide the substantially rectangular beam for forming the substantially rectangular scribe segments of the scribe channel or "line." The substantially rectangular beam can have a pulse width ranging from, for example, 1 ps to 50 ps. Other useful ranges include 1 ps to 500 ps; 1 ps to 250 ps; 1 ps to 100 ps and 1 ps to 75 ps. The lower limit in the foregoing ranges can be below 1 ps, such as, for example 0.1 or 0.5 ps.

The techniques taught herein, such as, for example the use of pulsed a substantially rectangular (e.g., square) beam and/or a beam having a substantially uniform intensity distribution can allow fast and efficient scribing of photovoltaic devices while avoiding undesirable device damage that can lead to low manufacturing yield and/or low post manufacturing device reliability. The methods and apparatus disclosed herein can allow substantially complete removal of an overlying target region(s) (e.g., a-Si/CdTe for P2 scribes or a-Si/CdTe and back contact metallization for P3 scribes) so as to satisfactorily expose, for example, a non target region (e.g., a TCO layer). Sharp scribe sidewalls are formed with no substantial interlayer mixing between dissimilar materials (e.g., between one or more of the a-Si/CdTe, back contact metallization and TCO layer for P3 scribes) that would substantially impair device performance. The sharp sidewalls and the avoidance of interlayer mixing can be maintained along a scribe line at higher processing speeds and/or with lowered scribe section overlap for numerous speed/overlap combinations, such as those noted above.

Furthermore it is found that scribes created using the spatially shaped picosecond pulsed laser beams can minimize micro-cracking and debris re-deposition which may reduce efficiency or device reliability, or cause mechanical dislocations, such as layer dislocation from thermal blistering, again at a wide variety of increase processing speeds and/or lower overlap combinations, such as is noted above.

The present disclosure includes examples directed to processing photovoltaic devices comprising one or more of a-Si, $SiN_x$, $SiO_x$ and CdTe. However, techniques (i.e., methods and apparatus) taught herein are also application to the processing of other photovoltaics materials, such as, for example, or chalcopyrite type semiconductors such as copper indium diselenide, copper indium gallium diselenide (materials with copper, indium gallium and selenide are often referred to as CIGS materials) or copper indium gallium disulphide). Photovoltaic devices comprising such materials are often used in the substrate configuration, and laser beams for processing can be directed through a top TCO region, for example.

Figure 14:
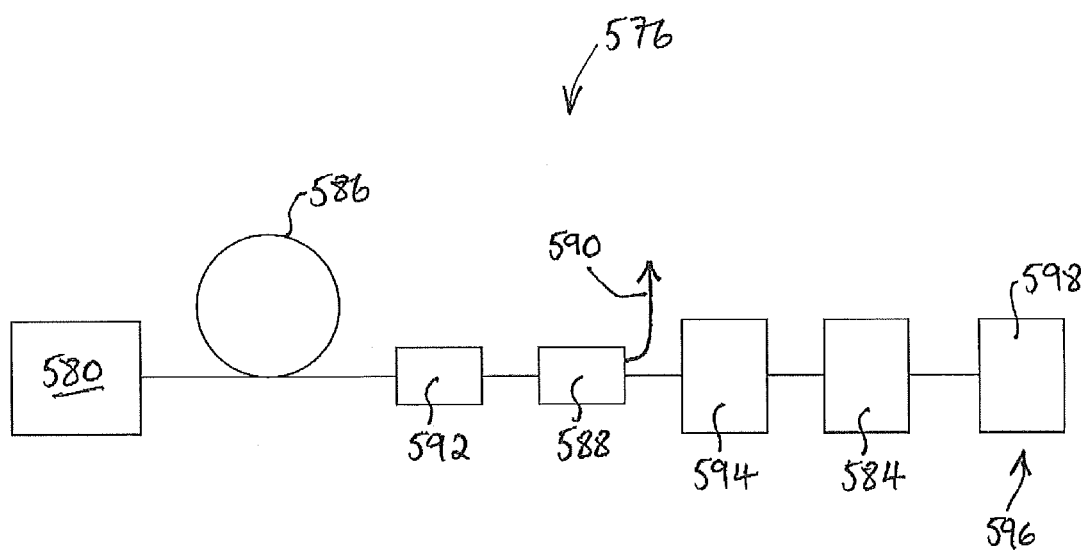
FIG. 14 is a schematic representation of an embodiment of an optical architecture for a fibre laser; and, FIG. 15 is a schematic representation of an embodiment of an optical architecture of an optical fibre amplifier for use with fibre laser illustrated in FIG. 14.

Referring to FIG. 14 of the drawings, there is illustrated an embodiment of an optical architecture for a fibre laser oscillator 576 that can be used in the UFMOPA 110 of FIG. 2. The fibre laser oscillator 576 can be mode locked, and passive or active techniques can be used to achieve mode locking. The embodiment of a fibre laser oscillator shown in FIG. 9 is passively mode locked. The passively mode locked fibre laser (PMLFL) oscillator 576 includes a laser cavity comprising a semiconductor saturable absorber mirror (SESAM) 580 at one end of the cavity as the mode locking element and a second reflector 584, which can comprise, for example, a fibre Bragg grating (FBG), at the other end of the cavity. The laser cavity can also include a length of active optical fibre 586, such as, for example, a length of rare earth doped (RED) optical fibre, and a coupler 588 for providing the output 590 from the fibre laser oscillator 576. The length of active optical fibre 586 can comprise a short length (e.g., tens of cm's) of single mode (SM) ytterbium-doped fibre, having, for example, a core diameter of 4-5 μm, a cladding diameter of 125 μm, and a concentration of Yb disposed in the core of the fibre for providing, for example, an absorption of about 300 dB/m in the 980 nm band. The pump source 596 can comprise a single emitter laser diode 598 operating in the 980 nm absorption band of ytterbium and providing an output power in the range of hundreds of mW, and can pump the laser cavity through the fibre Bragg grating (FBG) reflector 584, which can be transmissive at the pump wavelength. The fibre laser oscillator 576 can output, for example, a pulse width of a few to tens of ps, a center wavelength of 1064 nm, and operate at PRF of 20 MHz. The pulses can have an energy in the pJ range, and the average power of the fibre laser oscillator 576 can be in the range of a few mW to a few tens of mW.

Note that in an alternative embodiment of the fibre laser oscillator 576, the grating 584 can be partially transmissive at the operating wavelength of the PMLFL such the cavity output is through the grating 584. In this instance the pump optical energy need not be provided to the laser cavity through the grating 584 as shown in FIG. 14, but instead reference numeral 588 can represent a wavelength division multiplex (WDM) coupler for coupling the pump optical energy to the laser cavity (and passing 1064 nm), where reference numeral 590 would represent a WDM input arm to which the laser diode 598 is optically coupled.

Figure 15:
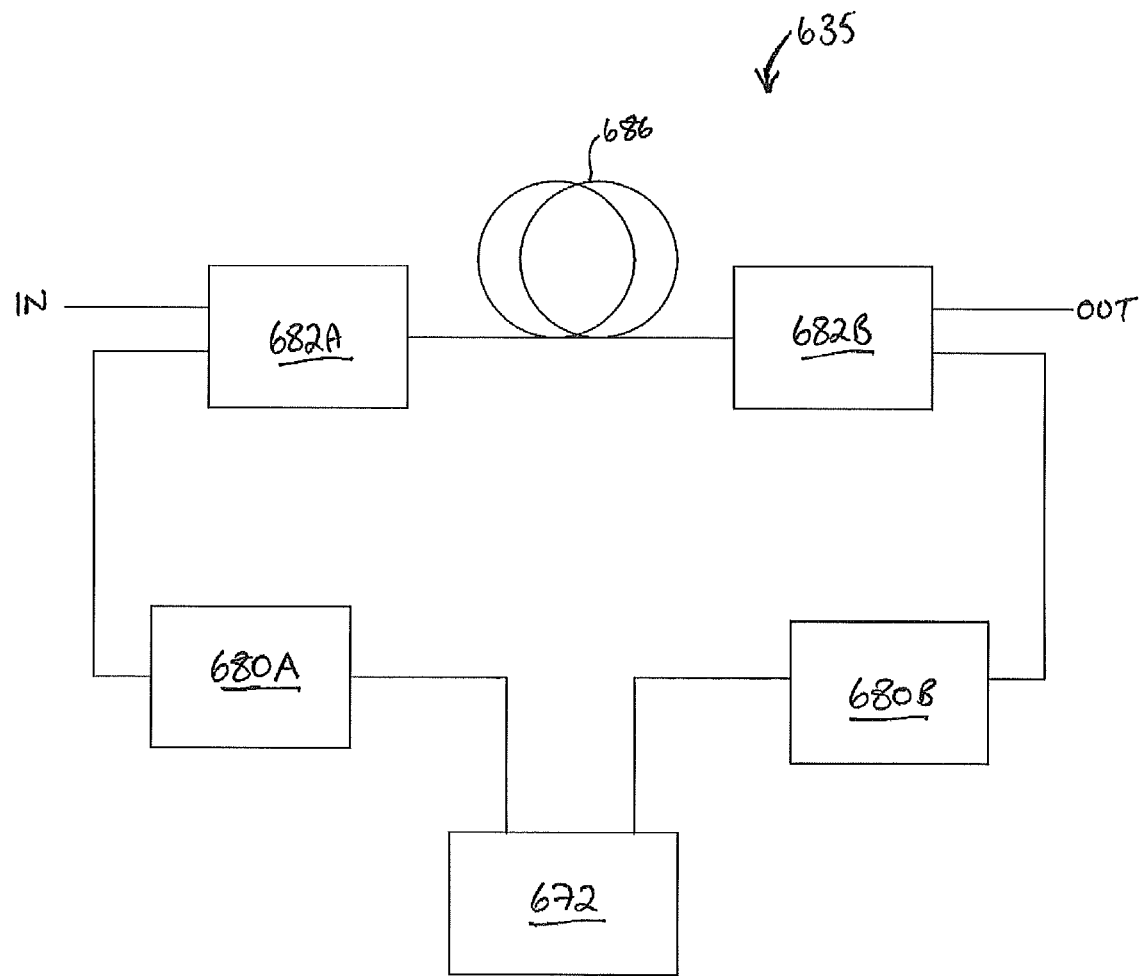

Referring to FIG. 15 of the drawings, there is illustrated an embodiment of the architecture of an optical fibre amplifier 635 that can be located downstream of the fibre laser oscillator 576 as part of the UFMOPA 110. The arrangement of a laser oscillator with an optically downstream amplifier to provide a higher power output from the amplifier than would typically be available from the oscillator alone is known in the art as a master oscillator-power amplifier or MOPA. The amplifier 635 is fibre based and can include a pair of pump sources 680A and 680B, which can each comprise a fibre pigtailed laser diode that provides pumping optical energy via optical couplers 682A and 682B, respectively, to the length of RED optical fibre 686. A controller (not shown) can control gain of the amplifier 635 via control of the optical power emitted by the pump sources 680A and 680B, such as by controlling the current supplied to the laser diodes comprised by the pump sources 680A and 680B.

The pump sources 680A and 680B can each comprise a 200 mW 980 nm laser diode. The optical couplers 682A and 682B, which can each comprise a WDM optical fibre coupler that couples the 980 nm optical pumping energy to the core of the length of RED fibre 686 while providing low insertion loss to the optical energy being amplified by the length of RED fibre 686. The length of RED fibre 686 can include a Yb-doped core having a diameter of approximately 6 μm and a cladding having a diameter of approximately 125 μm. The core can have a numerical aperture (NA) of approximately 0.14. The core can include a concentration of Yb sufficient, for example, for providing greater than 100 dB/m at 915 nm. One suitable fibre is the YB 500 fibre available from specialty optical fibre manufacturer CorActive High-Tec Inc., having coordinates of 2700 Jean-Perrin, Suite 121, Quebec City, QC, Canada G2C 1S9.

The optical fibre amplifier 635 can be operated linearly or non-linearly. In the non-linear regime, the length of RED fibre 686 can modify (e.g., increase) the bandwidth of signal it amplifies via a non-linear effect, such as, for example, via the process of self phase modulation. If it is desired that the fibre amplifier operate linearly, it is typical to increase the core diameter of the length of RED 686 optical fibre to decrease the power density. For example, the core diameter can be greater than 10 μm, such as, for example, 15 μm. The core can also have a reduced NA, such as, for example, a NA of 0.09, and the length of RED optical fibre 686 can comprise what is known in the art as a Large Mode Area, or "LMA", optical fibre.

The term Master Oscillator Fibre Power Amplifier (MOFPA), as used herein, refers to a master oscillator power amplifier arrangement where at least one of the master oscillator and the power amplifier comprises an active optical fibre, such as a RED optical fibre, as an active element. Typically both the master oscillator and the power amplifier include active optical fibres. However, this need not be the case. For example, the master oscillator could comprise a microchip or diode laser that seeds an optical fibre amplifier, such as, for example, the optical fibre amplifier 635.

The pulse repetition rate of the output from a MOFPA (typically in the MHz range) can be reduced via a "pulse picker", which can comprise an Acousto Optic Modulator (AOM), located optically downstream of one or both the master oscillator and the power amplifier. Such "pulse picking" can reduce the pulse repetition rate to the kHz range that is often used in the processing of materials. "Pulse picking" is known in the art, and is not further described herein. Also, as the skilled worker can ascertain from the teachings herein, more than one amplifier stage can be used optically downstream of a master oscillator, and the number of stages, and the gain each provides, can be adjusted to provide a particular power output from the MOFPA in terms of pulse energy, peak power, average power, etc Although FIGS. 14 and 15 show optically pumping a laser oscillator or an optical fiber amplifier using discrete couplers or, in the case of an oscillator, end pumping through a fiber Bragg grating, other techniques can be used. For example, it is also possible to pump a length of rare earth doped fiber of an oscillator or amplifier via an arrangement wherein a pump fiber runs adjacent to and coextensive with the rare earth doped fiber within a common jacket or coating. A fiber that includes both the rare earth doped fiber and the pump fiber can be drawn as a single continues fiber structure from a draw tower. The present disclosure is directed to each individual feature, system, material and/or method described herein. In addition, any combination of two or more such features, systems, materials and/or methods, if such features, systems, materials and/or methods are not mutually inconsistent, is included within the scope of the present invention. However, those skilled in the art would readily appreciate that all parameters, dimensions, materials and configurations described herein are meant to be exemplary and that in certain practices of the invention actual parameters, dimensions, materials and configurations can depend on specific applications for which the teaching of the present disclosure is used. Accordingly, one of ordinary skill understands that the invention may be practiced otherwise than as specifically described and remain within the scope of the appended claims and equivalents thereto.

In the claims as well as in the specification above all transitional phrases such as "comprising," "including," "carrying," "having," "containing," "involving" and the like are understood to be open-ended. Only the transitional phrases "consisting of" and "consisting essentially of" shall be closed or semi-closed transitional phrases, respectively, as set forth in the U.S. Patent Office Manual of Patent Examining Procedure §2111.03.

The phrase "A or B" as in "one of A or B" is generally meant to express the inclusive "or" function, meaning that all three of the possibilities of A, B or both A and B are included, unless the context clearly indicates that the exclusive "or" is appropriate (i.e., A and B are mutually exclusive and cannot be present at the same time). "At least one of A, B or C" (as well as "at least one of A, B and C") reads on any combination of one or more of A, B and C, including, for example the following: A; B; C; A & B; A & C; B & C; A & B; as well as on A, B & C.

It is generally well accepted in patent law that "a" means "at least one" or "one or more." Nevertheless, there are occasionally holdings to the contrary. For clarity, as used herein "a" and the like mean "at least one" or "one or more." The phrase "at least one" may at times be explicitly used to emphasize this point. Use of the phrase "at least one" in one claim recitation is not to be taken to mean that the absence of such a term in another recitation (e.g., simply using "a") is somehow more limiting. Furthermore, later reference to the term "at least one" as in "said at least one" should not be taken to introduce additional limitations absent express recitation of such limitations. For example, recitation that an apparatus includes "at least one widget" and subsequent recitation that "said at least one widget is colored red" does not mean that the claim requires all widgets of an apparatus that has more than one widget to be red. The claim shall read on an apparatus having one or more widgets provided simply that at least one of the widgets is colored red. Similarly, the recitation that "each of a plurality" of widgets is colored red shall also not mean that all widgets of an apparatus that has more than two red widgets must be red; plurality means two or more and the limitation reads on two or more widgets being red, regardless of whether a third is included that is not red, absent more limiting explicit language (e.g., a recitation to the effect that each and every widget of a plurality of widgets is red).

What is claimed is:

1. A laser assembly, comprising:
   a picosecond laser beam shaping assembly for shaping a picosecond laser beam for use in patterning photovoltaic devices, the assembly including
   a pulsed fibre laser for generating picosecond laser pulses;
   a harmonic conversion element for converting laser pulses at a first laser wavelength having a first spectral bandwidth to laser pulses at a second laser wavelength having a second spectral bandwidth; and,
   a beam shaping apparatus for shaping the laser beam at the second laser wavelength and having a beam shaping element having a spectral bandwidth that substantially corresponds to the second spectral bandwidth so as to produce a laser beam having a substantially rectangular cross-sectional intensity profile.

2. A laser assembly according to claim 1, wherein the second spectral bandwidth is less than the first spectral bandwidth.

3. A laser assembly according to claim 1, wherein the first laser wavelength is substantially 1μm.

4. A laser assembly according to claim 1, wherein the picosecond laser pulses comprise a pulse width in the range of 0.1ps to 100ps.

5. A laser assembly according to claim 4, wherein the picosecond laser pulses comprise a pulse width in the range of 1ps to 50ps.

6. A laser assembly according to claim 1, wherein the second laser wavelength is substantially 0.5μm.

7. A laser assembly according to claim 1, wherein the beam shaping apparatus further comprises an aperture.

8. A laser assembly according to claim 7, wherein the aperture comprises a substantially rectangular shape.

9. A laser assembly according to claim 7, wherein the aperture comprises a substantially square shape.

10. A laser assembly according to claim 7, wherein the aperture is spaced from the beam shaping element.

11. A laser assembly according to claim 7, wherein the aperture is integrated into a heat sink and is spaced from the beam shaping element.

12. A laser assembly according to claim 1, wherein the beam shaping element comprises a diffractive optical element.

13. A laser assembly according to claim 1, wherein the spectral bandwidth of the beam shaping element is less than 30nm.

14. A laser assembly according to claim 13, wherein the spectral bandwidth of the beam shaping element is less than 10nm.

15. A laser assembly according to claim 1, further comprising at least one optical lens element for imaging the shaped laser beam at the second laser wavelength onto the photovoltaic device.

16. A laser assembly according to claim 15, wherein the at least one optical element is arranged to produce a minified image of a substantially rectangular cross-sectional laser beam intensity profile at the second laser wavelength, on the photovoltaic device.

17. A laser assembly according to claim 1, wherein the shaped laser beam at the second laser wavelength comprises a substantially square cross sectional shape.

18. A laser assembly according to claim 1, wherein the shaped laser beam at the second laser wavelength comprise a fluence at the photovoltaic device in the range of $0.05J/cm^2$ to $10J/cm^2$.

19. A laser assembly according to claim 1, wherein the photovoltaic device comprises at least one of amorphous silicon, a nitride of silicon, an oxide of silicon or cadium telluride.

20. A method of shaping a picosecond laser beam for use in patterning photovoltaic devices, the method comprising: passing picosecond laser pulses generated from a pulsed fibre laser source at a first laser wavelength and comprising a first spectral bandwidth to a harmonic conversion element to convert the laser pulses at the first laser wavelength to laser pulses at a second laser wavelength comprising a second spectral bandwidth; and, passing the laser pulses at the second laser wavelength to a beam shaping apparatus having a beam shaping element having a further spectral bandwidth that substantially corresponds to the second spectral bandwidth so as to produce a laser beam having a substantially rectangular cross-sectional intensity profile; and patterning a photovoltaic device with the laser beam having the substantially rectangular cross section intensity profile.

21. A method according to claim 20 wherein the second spectral bandwidth is less than the first spectral bandwidth.

22. A method according to claim 20 wherein the first laser wavelength is in the range of 0.2µm to 1.6µm.

23. A method according to claim 22 wherein the second laser wavelength is substantially 0.5µm.

24. A method according to claim 20 wherein the picosecond laser pulses comprise a pulse width in the range of 0.1ps to 100ps.

25. A semiconductor scribing assembly comprising: a pulsed fibre laser for generating picosecond laser pulses; a harmonic conversion element for converting laser pulses at a first laser wavelength comprising a first spectral bandwidth to laser pulses at a second laser wavelength comprising a second spectral bandwidth; at least one shaping element for shaping the laser beam at the second laser wavelength, at least one imaging element for imaging the shaped laser beam comprising laser pulses at the second laser wavelength onto the semiconductor to pattern the semiconductor; wherein the spectral bandwidth of the beam shaping element substantially corresponds to the second spectral bandwidth so as to produce a laser beam having a substantially rectangular cross-sectional intensity profile.

26. A semiconductor scribing process, comprising: passing picosecond laser pulses generated from a pulsed fibre laser source at a first laser wavelength comprising a first spectral bandwidth to a harmonic conversion element to convert the laser pulses at the first laser wavelength to laser pulses at a second laser wavelength comprising a second spectral bandwidth; passing the laser pulses at the second laser wavelength to a beam shaping apparatus having a beam shaping element having a further spectral bandwidth that substantially corresponds to a the second spectral bandwidth so as to produce a laser beam having a substantially rectangular cross-sectional intensity profile; and, imaging the shaped laser beam comprising the laser pulses at the second laser wavelength using an imaging element onto the semiconductor, to pattern the semiconductor.

27. A method of shaping a picosecond laser beam for use in scribing photovoltaic devices; the method comprising: passing picosecond laser pulses generated from a pulsed fibre laser source in a wavelength range 500-550nm to a shaping element for providing a shaped picosecond pulsed laser beam; and scribing a photovoltaic device with the shaped laser beam.

\* \* \* \* \*